United States Patent
El-halwagy et al.

(10) Patent No.: US 12,308,845 B2
(45) Date of Patent: May 20, 2025

(54) REDUCING DUTY CYCLE MISMATCH OF CLOCKS FOR CLOCK TRACKING CIRCUITS

(71) Applicant: Microchip Technology Incorporated, Chandler, AZ (US)

(72) Inventors: Waleed El-halwagy, Ottawa (CA); Youcef Fouzar, Ottawa (CA); Kristopher Kshonze, Ottawa (CA); William Roberts, Highland, UT (US); Faizal Warsalee, Sittsville (CA)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 18/167,722

(22) Filed: Feb. 10, 2023

(65) Prior Publication Data

US 2024/0007111 A1 Jan. 4, 2024

Related U.S. Application Data

(60) Provisional application No. 63/367,434, filed on Jun. 30, 2022.

(51) Int. Cl.
*H03L 7/081* (2006.01)
*H03K 5/135* (2006.01)
*H03K 5/156* (2006.01)
*H03K 7/08* (2006.01)

(52) U.S. Cl.
CPC ........... *H03L 7/0812* (2013.01); *H03K 5/135* (2013.01); *H03K 5/1565* (2013.01); *H03K 7/08* (2013.01)

(58) Field of Classification Search
CPC ..... H03L 7/0812; H03L 7/0814; H03K 5/135; H03K 5/1565; H03K 7/08
See application file for complete search history.

(56) References Cited

U.S. PATENT DOCUMENTS 5,963,071 A * 10/1999 Dowlatabadi ...... H03K 5/00006
327/276
6,967,514 B2 11/2005 Kizer et al.
7,199,632 B2 * 4/2007 Chun .................. H03K 5/1565
327/175

(Continued)

FOREIGN PATENT DOCUMENTS

EP 2259428 A2 12/2010
WO 2014/035771 A2 3/2014

OTHER PUBLICATIONS

International Search Report for International Application No. PCT/US2023/062424, mailed Jul. 19, 2023, 6 pages.

(Continued)

*Primary Examiner* — John W Poos
(74) *Attorney, Agent, or Firm* — TraskBritt

(57) ABSTRACT

One or more examples relate to a method. The method may include: comparing a first value and a second value, the first value representing a duty cycle of a reference clock and the second value representing a duty cycle of an output clock generated by a clock tracking circuit to track the reference clock; setting a duty cycle of a changed clock to reduce duty cycle mismatch between the reference clock and the output clock indicated by the comparing; and providing the changed clock having set duty cycle in lieu of the one of the reference clock or the output clock.

19 Claims, 16 Drawing Sheets

(56) References Cited

U.S. PATENT DOCUMENTS

| | | |
|---|---|---|
| 9,634,678 B1 | 4/2017 | Caffee et al. |
| 10,367,493 B1* | 7/2019 | Addepalli ............. H03L 7/0891 |
| 2008/0111604 A1 | 5/2008 | Boerstler et al. |
| 2009/0128207 A1 | 5/2009 | Chang et al. |
| 2010/0188126 A1* | 7/2010 | Cheung ................ H03K 5/1565 |
| | | 327/175 |
| 2013/0063191 A1 | 3/2013 | Patil et al. |

OTHER PUBLICATIONS

International Search Report for International Application No. PCT/US2023/062426, mailed Jun. 12, 2023, 6 pages.

Written Opinion of the International Searching Authority for International Application No. PCT/US2023/062424, mailed Jul. 19, 2023, 7 pages.

Written Opinion of the International Searching Authority for International Application No. PCT/US2023/062426, mailed Jun. 12, 2023, 7 pages.

* cited by examiner

REDUCING DUTY CYCLE MISMATCH OF CLOCKS FOR CLOCK TRACKING CIRCUITS

CROSS-REFERENCE TO RELATED APPLICATION

This application claims the benefit under 35 U.S.C. § 119(e) of the priority date of U.S. Provisional Patent Application Ser. No. 63/367,434, filed Jun. 30, 2022, for DUTY CYCLE CORRECTION AND MATCHING TECHNIQUES, the contents and disclosure of which is incorporated herein in its entirety by this reference.

FIELD

One or more examples relate, generally, to clock tracking circuits for tracking an output clock to a reference clock. More specifically, one or more examples relate to reducing duty cycle mismatch between a reference clock and an output clock generated by a clock tracking circuit to track the reference clock.

BACKGROUND

Clock tracking circuits such as phase locked loops and delay locked loops, are circuits utilized to track clocks and other oscillating signals. An output signal of a clock tracking circuit is locked to the phase and frequency of a reference signal. Clock tracking circuits are utilized in a variety of operational contexts, including when two signals having known relationships are utilized to transmit information.

BRIEF DESCRIPTION OF THE DRAWINGS

To easily identify the discussion of any particular element or act, the most significant digit or digits in a reference number refer to the figure number in which that element is first introduced.

DETAILED DESCRIPTION

Figure 1:
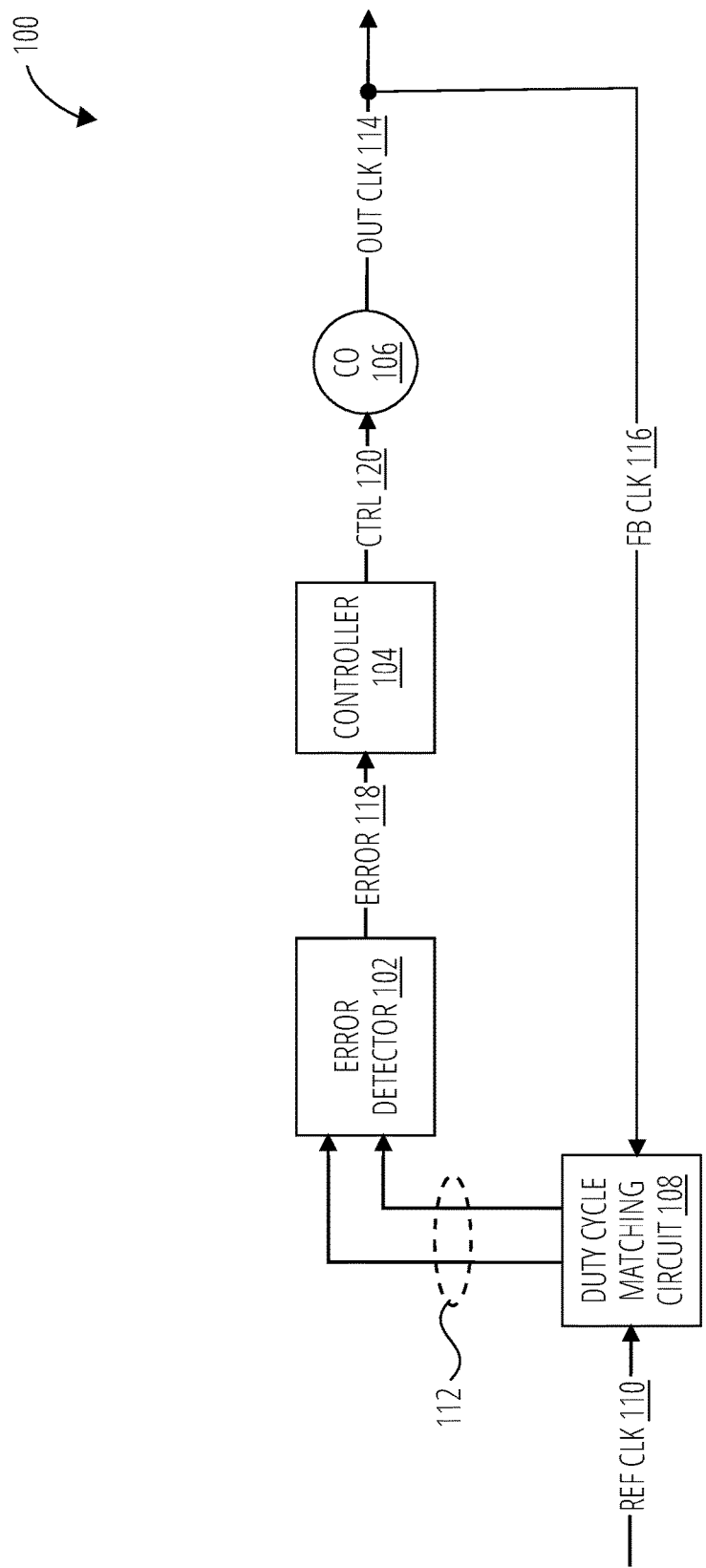
FIG. 1 is a block diagram depicting an apparatus to track a clock, in accordance with one or more examples.

In the following detailed description, reference is made to the accompanying drawings, which form a part hereof, and in which are shown, by way of illustration, specific examples of examples in which the present disclosure may be practiced. These examples are described in sufficient detail to enable a person of ordinary skill in the art to practice the present disclosure. However, other examples may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example of this disclosure to the specified components, steps, features, functions, or the like.

It will be readily understood that the components of the examples as generally described herein and illustrated in the drawing could be arranged and designed in a wide variety of different configurations. Thus, the following description of various examples is not intended to limit the scope of the present disclosure, but is merely representative of various examples. While the various aspects of the examples may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the examples disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to examples of the present disclosure.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, without limitation. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, any relational term, such as "over," "under," "on," "underlying," "upper," "lower," without limitation, is used for clarity and convenience in understanding the disclosure and accompanying drawings and does not connote or depend on any specific preference, orientation, or order, except where the context clearly indicates otherwise.

In this description the term "coupled" and derivatives thereof may be used to indicate that two elements co-operate or interact with each other. When an element is described as being "coupled" to another element, then the elements may be in direct physical or electrical contact or there may be intervening elements or layers present. In contrast, when an element is described as being "directly coupled" to another element, then there are no intervening elements or layers present. The term "connected" may be used in this description interchangeably with the term "coupled," and has the same meaning unless expressly indicated otherwise or the context would indicate otherwise to a person having ordinary skill in the art.

A clock signal or just "clock," is a signal that oscillates between a high state and a low state in a reliably predictable manner. A circuit can be responsive to a rising or falling edge of a clock to coordinate its actions.

Phase locked loops (PLLs) are used, generally, to generate an output clock that tracks a reference clock—e.g., are phase and frequency locked to the reference clock signal, without limitation. In a typical clock tracking circuit, an oscillator is controlled via one or more control paths to generate an output clock having the desired phase and frequency. When the frequency is different from the desired frequency (also called "frequency offset" or "frequency error"), the clock tracking circuit generates control signals via the one or more control paths to urge the oscillator's native frequency toward the desired frequency. At certain frequency ranges, a clock tracking circuit may exhibit jitter, which is an integration of phase noise in specific bandwidths.

Duty cycle distortion and duty cycle mismatch may contribute to jitter or spurs in a clock tracking circuit that compares an output clock (or a feedback signal representative of an output clock signal) to a reference clock. Duty cycle distortion is a difference between the duty of a clock signal and an ideal duty cycle, which ideal duty cycle may be 50%. Duty cycle mismatch is a difference between respective duty cycles of oscillating signals (e.g., clock signals) that are compared at least in terms of phase or frequency. Some clock tracking circuits individually correct the duty cycle distortion present in the reference clock, output clock, or both, and assume it will correct duty cycle mismatch between a reference clock and an output clock. However, the inventors of this disclosure appreciate that when the results of correcting duty-cycle distortion individually in two clock signals are combined, e.g., that of the reference clock and that of the output clock, errors incurred during the respective duty-cycle distortion correction processes is added—increasing overall error.

The inventors of this disclosure appreciate that duty cycle mismatch correction that utilizes both clock signals would be desirable, as a non-limiting example, by avoiding or reducing at least some of undesirable effects of applying separate processes to correct duty-cycle distortion, discussed above.

FIG. 1 is a block diagram depicting an apparatus 100 to track a clock (and may also be referred to herein as a "clock tracking circuit 100"), in accordance with one or more examples. As non-limiting examples, clock tracking circuit 100 may be a hybrid phase locked loop (PLL), an analog PLL, a digital PLL, a delay locked loop (DLL), an injection locked loop (ILL), or a frequency synthesizer.

Apparatus 100 includes an error detector 102, a controller 104, a controlled-oscillator 106, and a duty cycle matching circuit 108. Apparatus 100 operates, generally, to generate an output clock 114 phase-locked and frequency-locked to a reference clock 110.

Error detector 102 generates an error signal 118 that includes information about a phase and frequency difference between feedback clock 116 and reference clock 110. As non-limiting examples, error detector 102 may be or include one or more of a phase-frequency detector, a bang-bang phase detector, a time-to-digital converter, or a subsampling phase detector. Reference clock 110 may be generated by any suitable clock source for a given operational context. Feedback clock 116 may be the same as output clock 114 (e.g., output clock 114 is fed directly to an input of duty cycle matching circuit 108, without limitation) or a signal indicative of the phase, frequency, pulse width, and duty cycle of output clock 114. For example, the phase, frequency, pulse width, and duty cycle of feedback clock 116 may be the same or different than output clock 114, but in either case, is relatable back to the phase, frequency, pulse width, and duty cycle of output clock 114. As a non-limiting example, feedback clock 116 may be a frequency divided version of output clock 114 (frequency divider/buffer not depicted).

Controlled-oscillator 106 is an electronic oscillator for generating output clock 114 at least partially in response to control signal 120, which may be digital control signals (i.e., in the case of a digital controlled oscillator (DCO)), voltage control signals (i.e., in the case of a voltage controlled oscillator (VCO)), current control signals (i.e., in the case of a current controlled oscillator (CCO)) or a combination thereof (i.e., a hybrid controlled oscillator (e.g., any combination of digital, voltage, or current controlled, without limitation)).

In one or more examples, error signal 118 includes direction information and magnitude information. Direction information of error signal 118 indicates if output clock 114 lags in phase or leads in phase with respect to reference clock 110. Magnitude information of error signal 118 indicates an extent to which output clock 114 lags in phase or leads in phase with respect to reference clock 110 (i.e., an amount of phase difference). In one or more examples, error signal 118 may be utilized to determine phase and frequency information about output clock 114 and reference clock 110, and information about the differences there between.

In the specific non-limiting example depicted by FIG. 1, apparatus 100 includes a controller 104 to provide control signal 120, at least partially in response to error signal 118, to controlled-oscillator 106 to adjust output clock 114. Controller 104 may include circuits (analog circuits, digital circuits, or both) to provide proportional control and integral control of controlled-oscillator 106. Controller 104 may include a proportional control path for transient correction of phase differences between feedback clock 116 and reference clock 110 indicated by error signal 118. Controller 104 may include an integral control path to urge an average frequency of controlled-oscillator 106 toward a target frequency (e.g., a frequency of reference clock 110 or a multiple thereof, without limitation) in response to frequency differences between feedback clock 116 and reference clock 110 indicated by error signal 118.

Duty cycle matching circuit 108 provides matched clocks 112 including versions of reference clock 110 and feedback clock 116 having matched duty cycles as discussed herein. In one or more examples, duty cycle matching circuit 108 may change respective duty cycles of one or both of reference clock 110 and feedback clock 116. Matched clocks 112 may exhibit reduced duty cycle mismatch than exhibited between feedback clock 116 and reference clock 110. Reduced duty cycle mismatch may reduce jitter or spurs exhibited by apparatus 100, e.g., by output clock 114.

Figure 2:
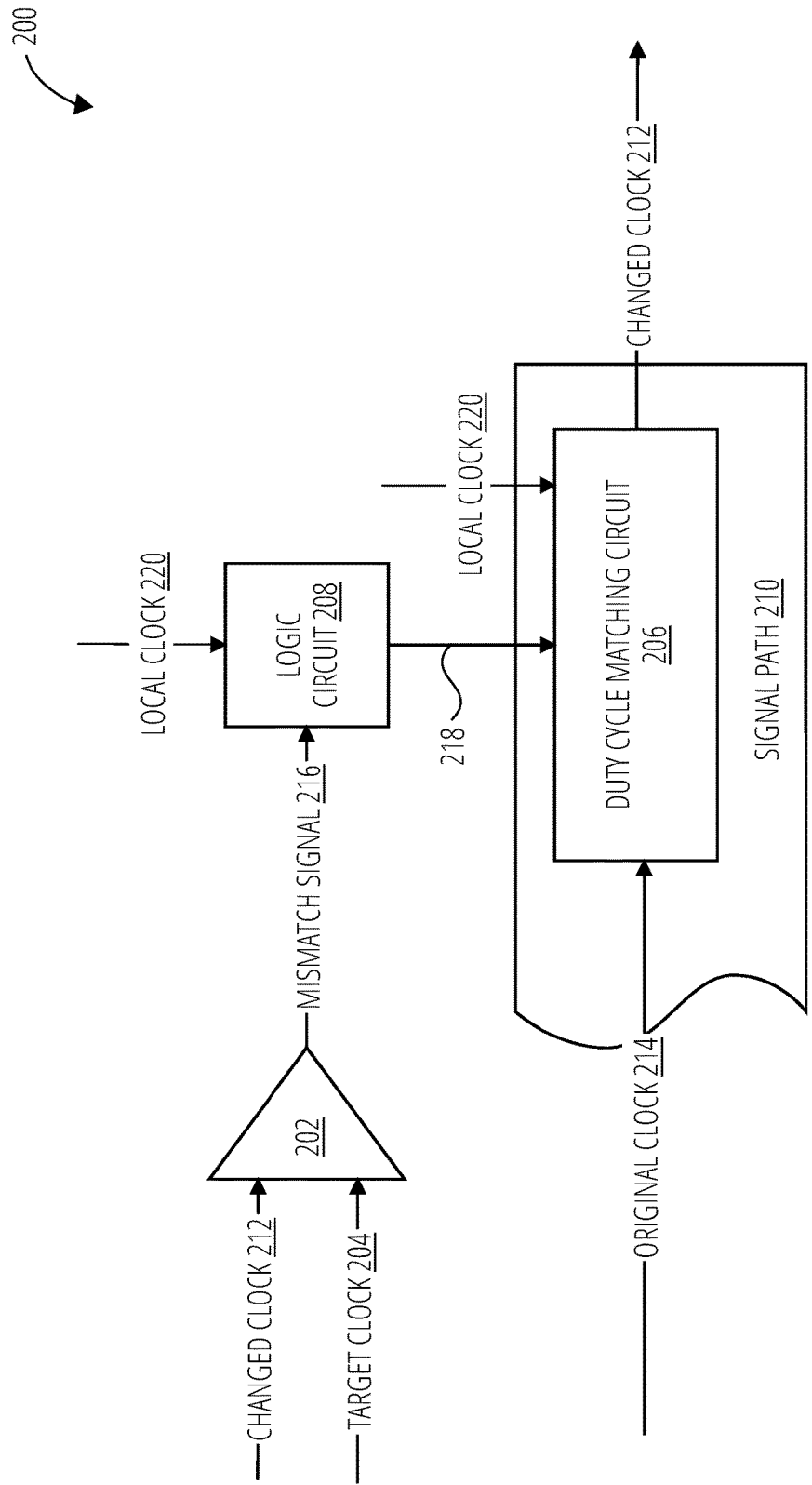
FIG. 2 is a block diagram depicting an apparatus to change a duty cycle of a clock, in accordance with one or more examples.

FIG. 2 is a block diagram depicting an apparatus 200 to change a duty cycle of a clock, in accordance with one or more examples. Apparatus 200 is a non-limiting example of a duty cycle matching circuit 108 of FIG. 1, and may also be referred to as a "duty cycle matching circuit 200."

Apparatus 200 generates a changed clock 212 having a duty cycle set to reduce duty cycle mismatch between the changed clock 212 and a target clock 204. Changed clock 212 may be provided in lieu of original clock 214. The duty cycle mismatch between changed clock 212 and target clock 204 may be less than the duty cycle mismatch between original clock 214 and target clock 204. In this manner, when changed clock 212 is provided in lieu of original clock 214, apparatus 200 may be understood to reduce duty cycle mismatch between original clock 214 and target clock 204. In one or more examples, "changing a duty cycle of a clock" includes, but is not limited to, generating a clock having a set duty cycle.

Changing a duty cycle of a clock may also be referred to herein as "calibrating a duty cycle of a clock" and process to do the same referred to herein as a "calibration process." In one or more examples, a calibration process may include multiple calibration cycles, during at least some of which a duty cycle of the changed clock 212 is incrementally set, as discussed below. The number of calibration cycles implemented is a matter of design choice and may be set, as a non-limiting example, based on specific operating conditions. In one or more examples, a number of calibration cycles may be variable, as a non-limiting example, when a given calibration process executes until duty cycle mismatch is below a predetermined threshold. In one or more examples, a number of calibration cycles may be variable up to a predetermined upper limit. In one or more examples, a number of calibration cycles may be variable with a predetermined lower limit (e.g., at least the lower limit number of calibration cycles are executed before determining duty cycle mismatch is below the predetermined threshold, without limitation).

In one or more examples, logic circuit 208 and duty cycle matching circuit 206 may be synchronized via local clock 220. Further, calibration cycles may be synchronized to clock cycles of local clock 220.

Apparatus 200 includes a comparison circuit 202, a logic circuit 208, and a duty cycle matching circuit 206 arranged in a signal path 210 of original clock 214. Original clock 214 is the clock to be changed. In one or more examples, original clock 214 may be feedback clock 116 or reference clock 110 of FIG. 1, and target clock 204 may be the other of feedback clock 116 or reference clock 110 of FIG. 1.

Comparison circuit 202 receives changed clock 212 and target clock 204, and generates mismatch signal 216 to indicate which of the respective duty cycles of changed clock 212 and target clock 204 is greater. Changed clock 212 is the output of apparatus 200. More specifically, mismatch signal 216 may indicate that respective duty cycles of changed clock 212 and target clock 204 are equal or not equal. If not equal, mismatch signal 216 may indicate which of the duty cycle of changed clock 212 or the duty cycle of target clock 204 is greater. A greater duty cycle may also be characterized herein as a "wider" duty cycle, since a pulse width of the clock having the greater duty cycle will be wider. Indicating the greater duty cycle implies the other duty cycle is lesser and the respective pulse width "narrower."

Logic circuit 208 generates matching settings 218 to set internal circuitry of duty cycle matching circuit 206 in a manner that increases or decreases a duty cycle of changed clock 212. In one or more examples, logic circuit 208 may determine matching settings 218 to increase or decrease a duty cycle of changed clock 212 by a predetermined amount over one or more calibration cycles of a calibration process. Over multiple calibration cycles, a duty cycle of changed clock 212 changes toward a duty cycle of target clock 204. If mismatch signal 216 indicates a duty cycle of changed clock 212 is greater than a duty cycle of target clock 204, logic circuit 208 generates matching settings 218 to decrease a duty cycle of changed clock 212 by the predetermined amount. If mismatch signal 216 indicates a duty cycle of changed clock 212 is lesser than a duty cycle of logic circuit 208, logic circuit 208 generates matching settings 218 to increase a duty cycle of changed clock 212 by the predetermined amount.

Duty cycle matching circuit 206 is arranged in a signal path 210 of original clock 214 and generates changed clock 212 at least partially responsive to original clock 214 and the matching settings 218 generated by logic circuit 208. By the end of a given calibration process, changed clock 212 is a duty cycle matched version of original clock 214. In various examples, a calibration process may execute until a duty cycle of changed clock 212 matches a duty cycle of target clock 204. Alternatively, in one or more examples, a calibration process operation may execute for a predetermined number of calibration cycles and then end. While the calibration process executes, a duty cycle of changed clock 212 may change to be generally more like a duty cycle of target clock 204, though respective duty cycles may not necessarily match at the end of the calibration process. Stated another way, while the calibration process executes, a mismatch between respective duty cycles of changed clock 212 and target clock 204 may decrease, though not be completely eliminated.

In one or more examples, changed clock 212 may be provided in lieu of reference clock 110 or output clock 114 of FIG. 1, as the case may be.

Figure 3:
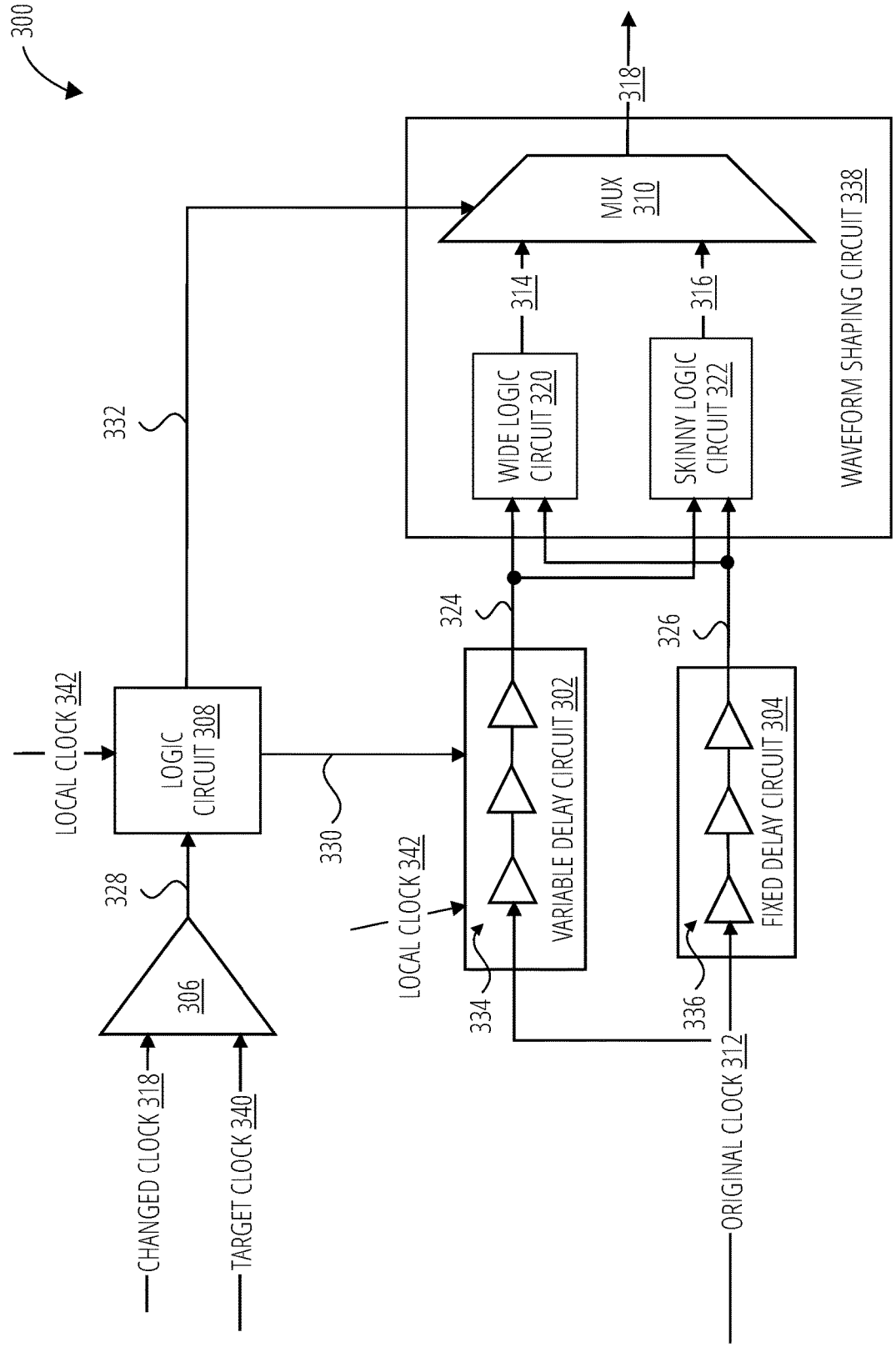
FIG. 3 is a block diagram depicting an apparatus to generate a changed clock, and more specifically, a clock having a changed duty cycle compared to a duty cycle of an original clock, in accordance with one or more examples.

FIG. 3 is a block diagram depicting an apparatus 300 to generate a changed clock, and more specifically, a clock having a changed duty cycle compared to a duty cycle of an original clock, and more specifically still, a clock having a changed pulse width compared to a pulse width of the original clock, in accordance with one or more examples.

Apparatus 300 includes a variable delay circuit 302, a fixed delay circuit 304, a comparison circuit 306, a logic circuit 308, and a waveform shaping circuit 338. Waveform shaping circuit 338 includes a wide logic circuit 320, a skinny logic circuit 322, and a multiplexer 310. Comparison circuit 306 is similar to comparison circuit 202 of FIG. 2 and is not re-described, here. Further, changed clock 318, target clock 340, and original clock 312 are similar to changed clock 212, target clock 204 and original clock 214 of FIG. 2, and are not re-described, here.

Variable delay circuit 302 receives delay setting 330 and original clock 312, and generates first delayed clock 324 at least partially responsive to delay setting 330 and original clock 312. A respective delay implemented by variable delay circuit 302 corresponds to delay setting 330 generated by logic circuit 308.

Fixed delay circuit 304 receives original clock 312 and generates second delayed clock 326 at least partially responsive to original clock 312. Fixed delay circuit 304 implements a fixed delay. In one or more examples, a delay implemented by fixed delay circuit 304 may be hard wired or coded, or fixed delay circuit 304 may be a variable delay circuit set by a control signal (e.g., generated by logic circuit 308 or a further logic circuit that is not depicted, without limitation) that indicates a substantially constant delay. In one or more examples, a delay implemented by fixed delay circuit 304 corresponds to an internal delay of apparatus 300.

In an initial state, variable delay circuit 302 implements substantially the same fixed delay implemented by fixed delay circuit 304.

In one or more examples, variable delay circuit 302 and fixed delay circuit 304 may internally implement any suitable technique to generate first delayed clock 324 and second delayed clock 326, respectively, based on original clock 312. A non-limiting example of a suitable technique may include enabling a number of buffers or inverters in a signal path to increase delay and disabling a number of buffers or inverters in the signal path to decrease delay.

In one or more examples, variable delay circuit 302 or fixed delay circuit 304 may respectively include delay cells 334/delay cells 336 to implement respective delays. In one or more examples, delay cells 334/delay cells 336 may utilize any suitable technique to implement delay. By way of non-limiting example, delay cells 334/delay cells 336 may be or include logic gates or devices (e.g., inverters, buffers, without limitation) that enable cascaded connection of a variable number of such gates or devices. By way of another non-limiting example, delay cells 334/delay cells 336 may be or include circuits, such as resistor-capacitor circuits where a variable number of resistors are selectively coupled in parallel. Delay exhibited by a resistor-capacitor circuit is a function of the time constant of the circuit, and is inversely proportional to the number of resistors selectively coupled in parallel.

First delayed clock 324 and second delayed clock 326 are both provided to waveform shaping circuit 338, and wide logic circuit 320 and skinny logic circuit 322, more specifically. Generally, waveform shaping circuit 338 performs waveform shaping as discussed below, e.g., waveform shaping circuit 338 generate changed clock 318 with a changed pulse width and, accordingly, a changed duty cycle.

Wide logic circuit 320 and skinny logic circuit 322 respectively provide waveform shaping functions of waveform shaping circuit 338. Wide logic circuit 320 shortens wide pulses (e.g., generates first changed clock 314 with a waveform having a shorter pulse width, and therefore lower duty cycle than first delayed clock 324, which first delayed clock 324 has the same pulse width as original clock 312), and skinny logic circuit 322 widens short pulses (e.g., generates second changed clock 316 with a waveform having a wider pulse width, and therefore greater duty cycle, than second delayed clock 326, which second delayed clock 326 has the same pulse width as original clock 312), as discussed below. Here, "wide" refers to a pulse width of changed clock 318 being longer than a desired pulse width, and "skinny" refers to a pulse width of changed clock 318 being shorter than a desired pulse width. As used herein, a "desired duty cycle" is a duty cycle of target clock 340 and a "desired pulse width" is a pulse width of target clock 340.

Multiplexer 310 selects one of first changed clock 314 or second changed clock 316 at least partially responsive to waveform shaping setting 332 generated by logic circuit 308. In this manner, waveform shaping setting 332 sets a waveform shaping function of waveform shaping circuit 338.

Logic circuit 308 generates delay setting 330 and waveform shaping setting 332 to reduce duty cycle mismatch between changed clock 318 and target clock 340 as indicated by mismatch signal 328. In one or more examples, matching settings 218 of FIG. 2 include delay setting 330 and waveform shaping setting 332.

The first delayed clock 324 differs in phase from second delayed clock 326 by an amount that corresponds to a delay implemented at variable delay circuit 302 in response to delay setting 330. Waveform shaping circuit 338, and more specifically wide logic circuit 320 and skinny logic circuit 322, as the case may be, utilize the amount of phase difference to set a pulse width of changed clock 318, and accordingly, set a duty cycle of changed clock 318.

In one or more examples, a delay amount by which variable delay circuit 302 is incremented or decremented may be fixed per calibration cycle to a predetermined amount (also referred to herein as a "delay step size"). For a given calibration cycle, the predetermined delay amount may be less than a total difference between a pulse width of changed clock 318 and a desired pulse width (or a pulse width of original clock 214 and target clock 204). Apparatus 300 may execute multiple calibration cycles to generate a changed clock 318 having desired pulse width or a changed clock 318 having a pulse width exhibiting reduced duty cycle mismatch to the duty cycle of target clock 340. Operation of logic circuit 308 and variable delay circuit 302 may be synchronized by local clock 342, and respective calibration cycles may correspond to clock cycles of local clock 342.

In various examples, a total number of calibration cycles may be limited to a predetermined number (a predetermined upper limit) and, in some cases, a pulse width of changed clock 318 that results from a calibration process may, or may not, substantially match a pulse width of target clock 340.

For a given calibration cycle, if mismatch signal 328 indicates a duty cycle of changed clock 318 is greater than a duty cycle of target clock 340, logic circuit 308 generates delay setting 330 and waveform shaping setting 332 to shorten a pulse width of changed clock 318 by a predetermined amount. If mismatch signal 328 indicates a duty cycle of changed clock 318 is less than a duty cycle of target clock 340, logic circuit 308 generates delay setting 330 and waveform shaping setting 332 to lengthen a pulse width of changed clock 318 by a predetermined amount.

If logic circuit 308 determines that a pulse width of second delayed clock 326 is skinnier than a desired pulse width, logic circuit 308 generates waveform shaping setting 332 to select second changed clock 316 input at multiplexer 310. If logic circuit 308 determines a pulse width of second delayed clock 326 is wider than a desired pulse width, logic circuit 308 generates waveform shaping setting 332 to select first changed clock 314 input at multiplexer 310.

Figure 4:
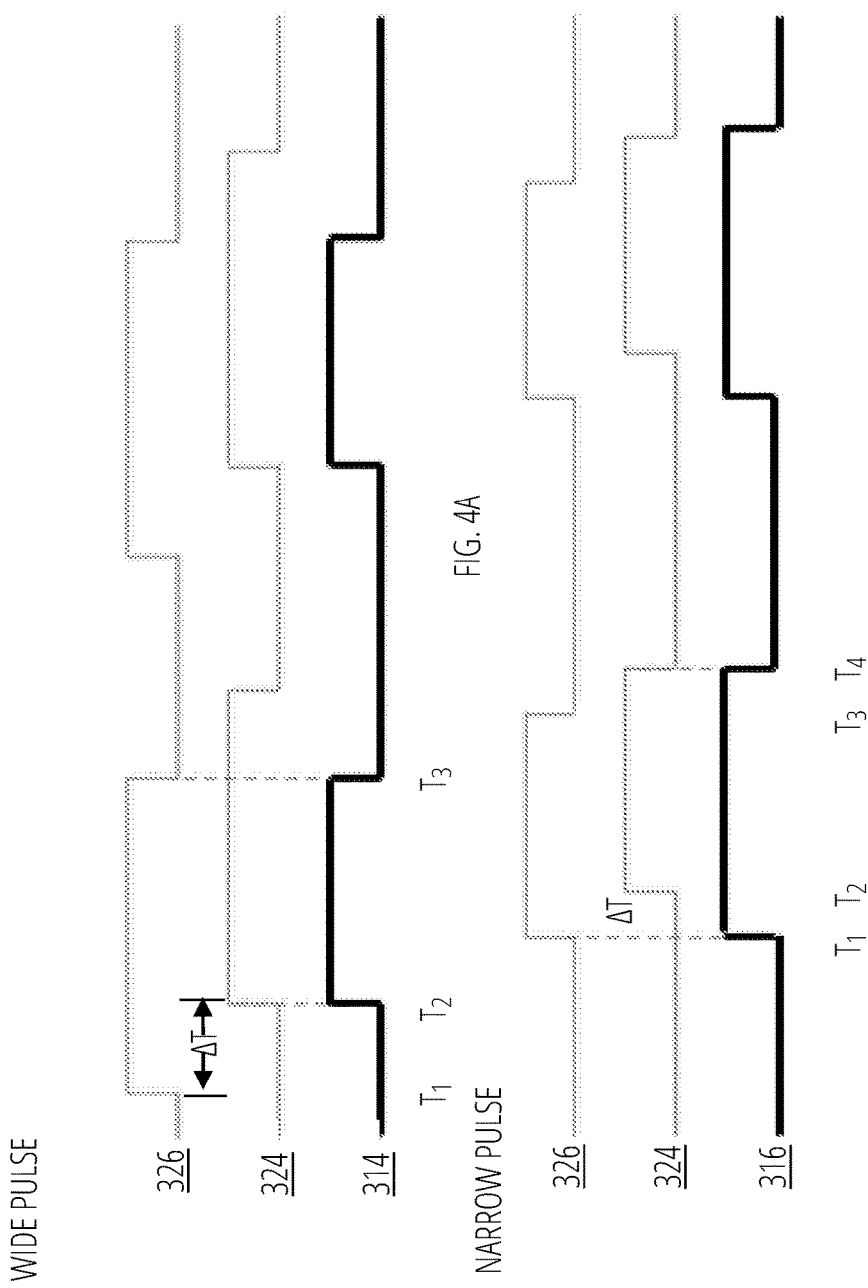
FIG. 4A is a timing diagram depicting signals during an example operation of the apparatus of FIG. 3 in accordance with one or more examples.
FIG. 4B is a timing diagram depicting signals during an example operation of the apparatus of FIG. 3 in accordance with one or more examples.

FIG. 4A and FIG. 4B are timing diagrams depicting signals 400 during respective example operations of apparatus 300. Specifically, FIG. 4A depicts second delayed clock 326, first delayed clock 324, and first changed clock 314 in an example operation of wide logic circuit 320, and FIG. 4B depicts second delayed clock 326, first delayed clock 324, and second changed clock 316 in an example operation of skinny logic circuit 322. In these examples, wide logic circuit 320 and skinny logic circuit 322 operate as, or are, an AND-gate and an OR-gate, respectively.

Turning to an example shortening of a wide pulse by wide logic circuit 320 depicted by FIG. 4A:

At time $T_1$, second delayed clock 326 exhibits a change from a first state to a second, different, state, here a rising edge, while first delayed clock 324 remains in a first state. At time $T_1$, wide logic circuit 320 generates first changed clock 314 in a first state because at least one of second delayed clock 326 and first delayed clock 324 are in the first state.

At time $T_2$, first delayed clock 324 exhibits a rising edge. A time duration $\Delta T$ from time $T_1$ to time $T_2$ is substantially equal to one or more delay increments, discussed above. Time duration $\Delta T$ may correspond to one or more delay increments of duty cycle matching circuit 206 or variable delay circuit 302.

Due to delay setting 330, a rising edge of first delayed clock 324 is "behind" (in terms of time) a rising edge of second delayed clock 326. At time $T_2$, wide logic circuit 320 generates first changed clock 314 in a second state because second delayed clock 326 and first delayed clock 324 exhibit the same, second, state.

At time $T_3$, second delayed clock 326 exhibits a change from a second state to a first state, here a falling edge, while first delayed clock 324 remains in a second state. At time $T_3$, wide logic circuit 320 generates a falling edge for first changed clock 314, i.e., first changed clock 314 changes to the first state, because at least one of second delayed clock 326 and first delayed clock 324 are in the first state. The time duration between times $T_2$ and $T_3$, i.e., the pulse width of first changed clock 314, is shorter than the time duration between $T_1$ and $T_3$, i.e., the pulse width of second delayed clock 326.

Turning to an example widening of a short pulse by skinny logic circuit 322 depicted by FIG. 4B:

At time $T_1$, second delayed clock 326 exhibits a change a change from a first state to a second, different, state, here a rising edge, while first delayed clock 324 remains in a first state. At time $T_1$, skinny logic 322 generates second changed clock 316 exhibiting a change from a first state to a second state because at least one of second delayed clock 326 and first delayed clock 324 are in the second state.

At time $T_2$, second delayed clock 326 exhibits a change from the first state to the second state (a rising edge), while first delayed clock 324 remains in the second state, so skinny logic circuit 322 continues to generate second changed clock 316 exhibiting the second state. Notably, the time duration between time $T_1$ and time $T_2$ may substantially equal one or more delay increments implemented by variable delay circuit 302, discussed above.

At time $T_3$, second delayed clock 326 exhibits a change from the second state to the first state (falling edge), while first delayed clock 324 remains in the second state, so skinny logic circuit 322 continues to generate second changed clock 316 exhibiting the second state because at least one of second delayed clock 326 and first delayed clock 324 are in the second state.

At time $T_4$, first delayed clock 324 exhibits a falling edge from the second state to the first state, while second delayed clock 326 remains in the first state, so skinny logic 322 generates second changed clock 316 exhibiting a falling edge from the second state to the first state because both second delayed clock 326 and first delayed clock 324 are in the first state. The time duration between times $T_1$ and $T_4$ is longer than the pulse width of either second delayed clock 326 or second delayed clock 326.

Figure 5:
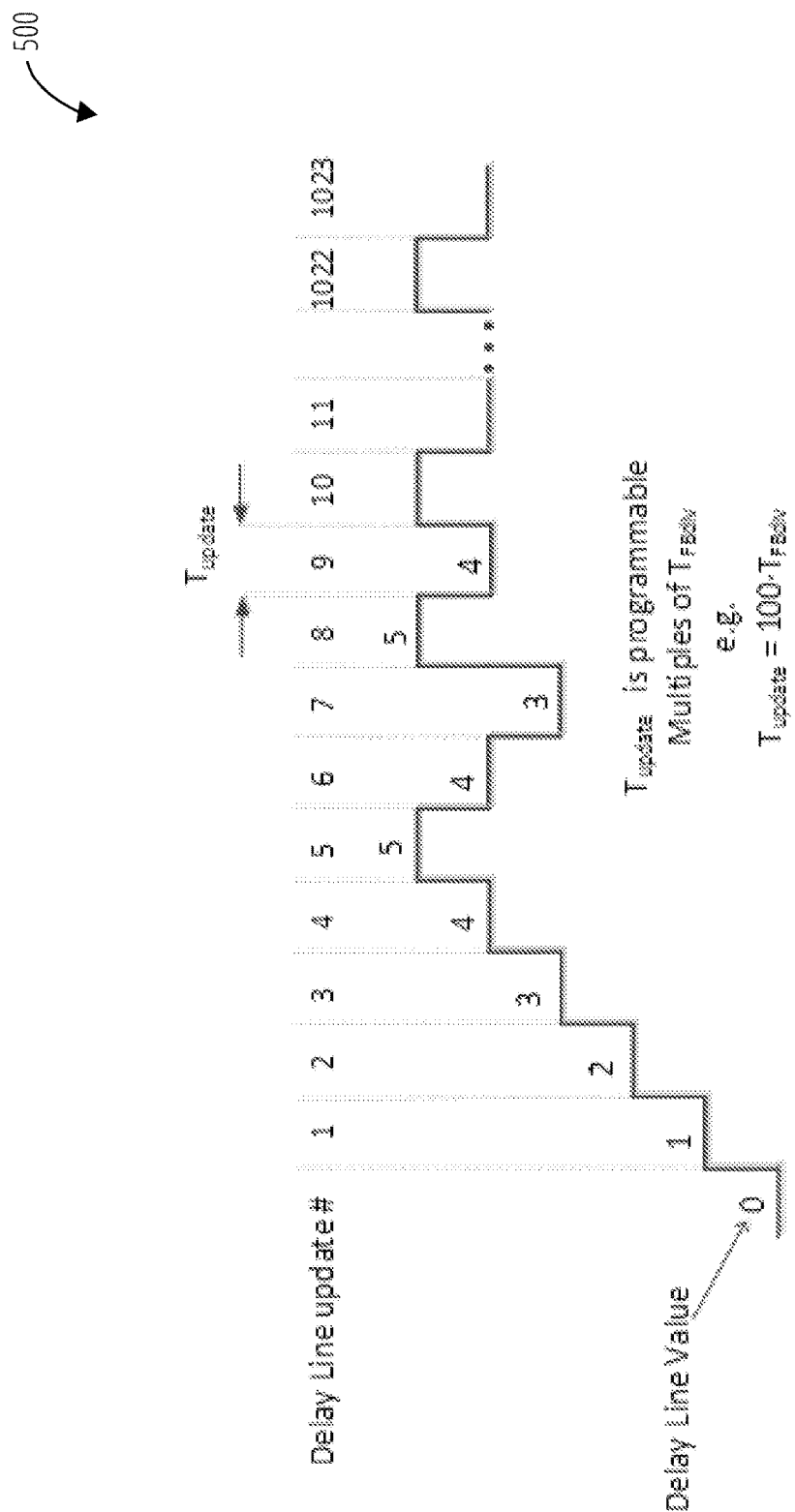
FIG. 5 is a diagram depicting a calibration process 500 in accordance with one or more examples.

FIG. 5 is a diagram depicting a calibration process 500 in accordance with one or more examples. Depicted are delay line update numbers ("Delay Line update #") which identify a sequence of respective calibration cycles of a calibration process 500. Also depicted are respective delay values ("Delay Line Value") applied during the respective calibration cycles. Each delay line value represents a multiple of a predetermined delay amount. For example, "1" represents 1×the predetermined delay amount, "2" represents 2×the predetermined delay amount, and so on and so forth.

In the specific example depicted by FIG. 5, respective delay values increment from delay line update number 0 to delay line update number 5, decrement from delay line update number 5 to delay line update number 7, and increment from delay line update number 7 to delay line update number 8. From delay line update number 8 to 1023, the delay line update number toggles between incrementing and decrementing, which indicates duty cycles are matched for purposes of calibration process 500.

Figure 6:
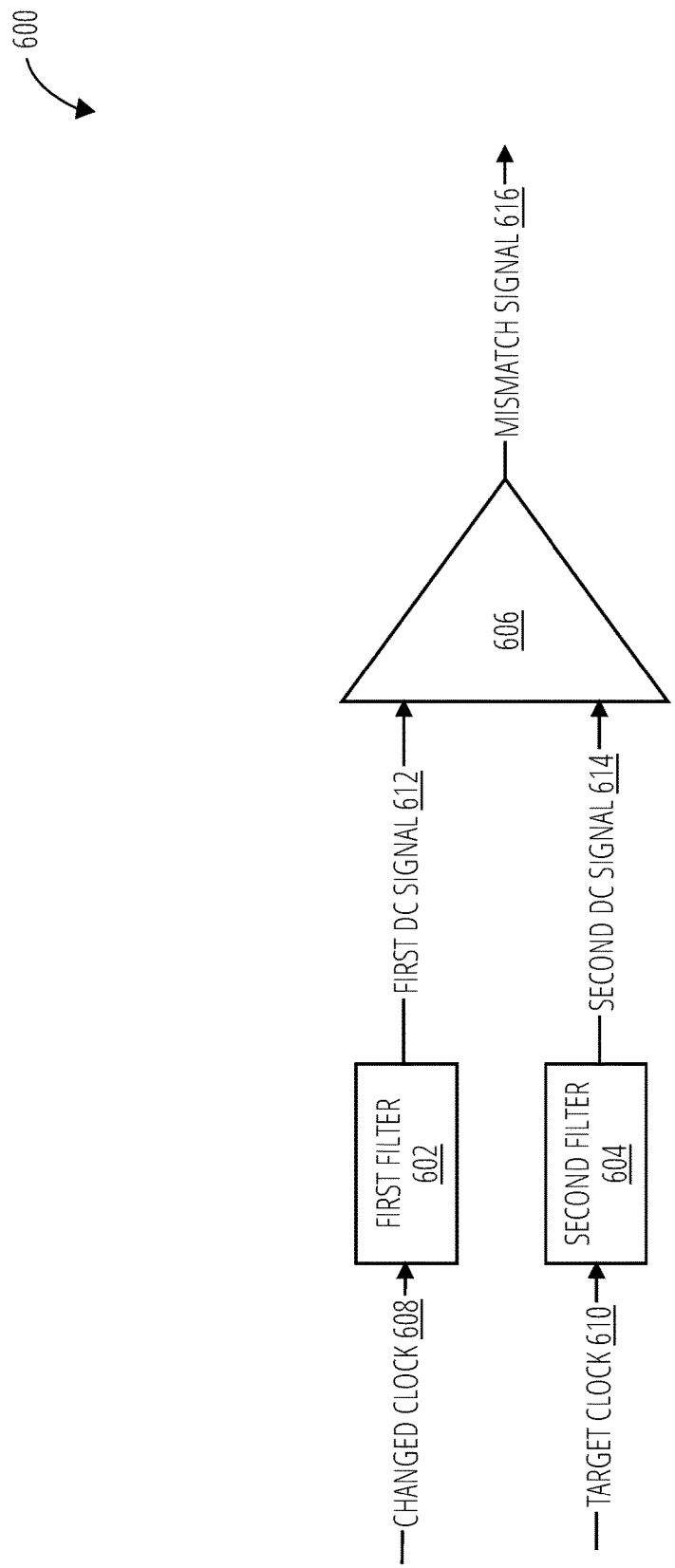
FIG. 6 is a block diagram depicting an apparatus to indicate which of a first value, representing a duty cycle of a reference clock, or a second value, representing a duty cycle of an output clock (or feedback clock indicating the same), is greater, in accordance with one or more examples.

FIG. 6 is a block diagram depicting an apparatus 600 to indicate which of a first value, representing a duty cycle of a reference clock, or a second value, representing a duty cycle of an output clock (or feedback clock indicating the same), is greater, in accordance with one or more examples. Apparatus 600 is a non-limiting example of a comparison circuit 202 of FIG. 2 and comparison circuit 306 of FIG. 3, and may be referred to as a "comparison circuit 600."

Apparatus 600 includes first filter 602, second filter 604, and comparator circuit 606. First filter 602 filters changed clock 608 to obtain a first DC signal 612, which is an analogue signal at a signal level proportional to a pulse width of changed clock 608 in relation to a total clock cycle of changed clock 608, and thus, represents a duty cycle of changed clock 608. Second filter 604 filters target clock 610 to obtain second DC signal 614, which is an analogue signal at a signal level proportional to a pulse width of target clock 610 in relation to a total clock cycle of target clock 610, and thus represents a duty cycle of target clock 610.

In one or more examples, first filter 602 and second filter 604 may be resistor-capacitor (RC) low-pass filter circuits. The RC circuits convert the oscillating or pulsed changed clocks 608 and 610 to a substantially fixed voltage level signal (e.g., a direct current (DC) signal). As a non-limiting example first filter 602 or second filter 604 may generate a DC voltage signal between 0 volts and 1 volt, inclusive (or a voltage level between 0 volts and a voltage level of a supply voltage). The specific DC voltage level generated by the first and second filters 602, 604 may be proportional to a duty cycle of changed clock 608 or target clock 610, respectively.

Comparator circuit 606 generates an output (mismatch signal 616) exhibiting a first state if first DC signal 612 is greater than second DC signal 614, a second state if second DC signal 614 is greater than first DC signal 612, and a third state if first DC signal 612 and second DC signal 614 are the same. In one or more examples, the third state is a toggling signal that changes between the first and second state due to non-ideal characteristics of comparison comparator circuit 606.

Figure 7:
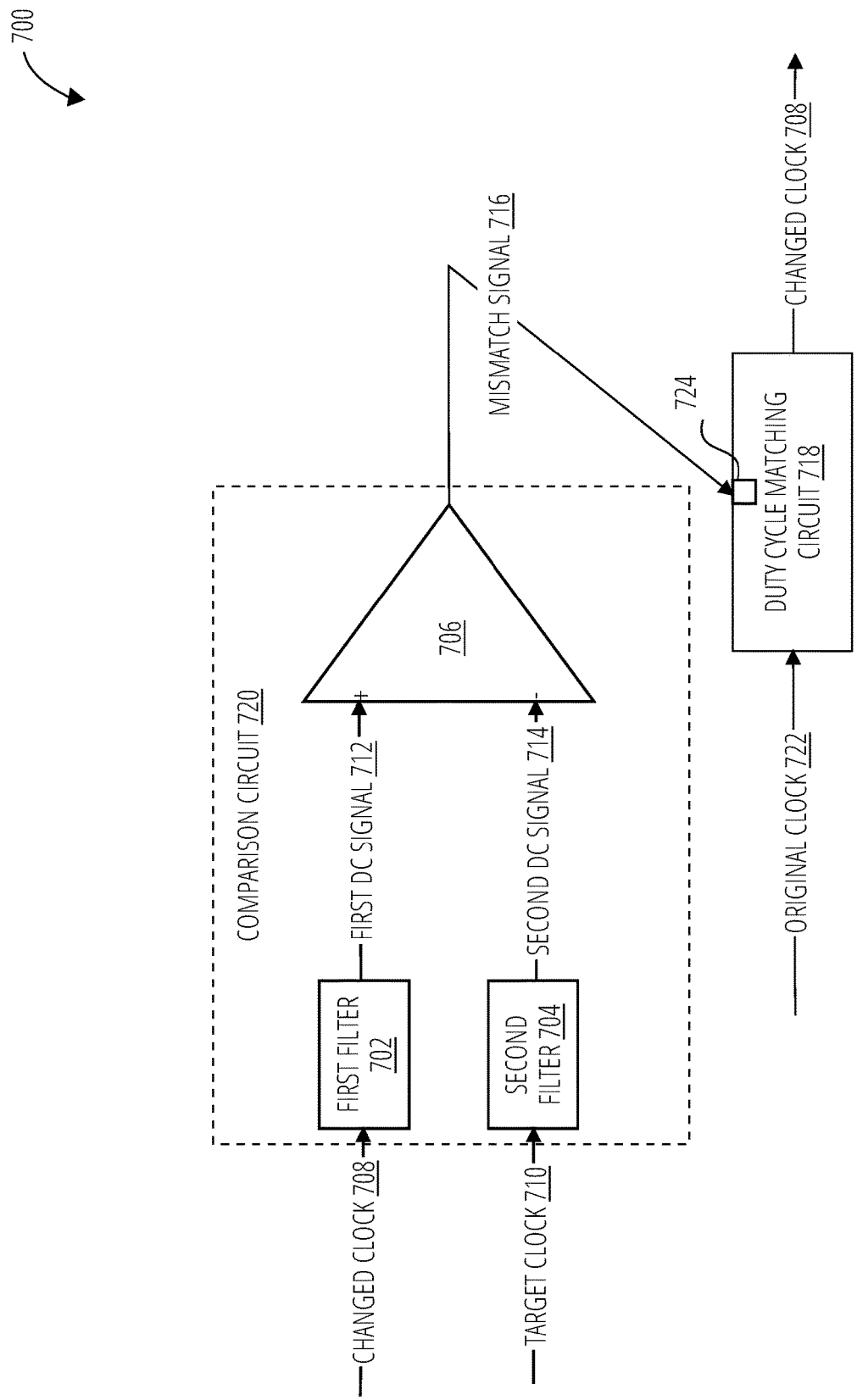
FIG. 7 is a block diagram depicting an apparatus to indicate which of a first value, representing a duty cycle of a reference clock, or a second value, representing a duty cycle of an output clock (or feedback clock indicating the same), is greater, in accordance with one or more examples.

FIG. 7 is a block diagram depicting apparatus 700 to indicate which of a first value, representing a duty cycle of a reference clock, or a second value, representing a duty cycle of an output clock (or feedback clock indicating the same), is greater, in accordance with one or more examples, as well as an amount of the difference between the duty cycle of the reference clock and the duty cycle of the output clock, as discussed above.

Apparatus 700 includes comparison circuit 720 and duty cycle matching circuit 718. Comparison circuit 720 includes first filter 702 and second filter 704, which are similar to first filter 602 and second filter 604 and aren't re-described here; and differential amplifier 706. Differential amplifier 706 generates a mismatch signal 716 that is proportional to a difference between first DC signal 712 and second DC signal 714. First DC signal 712 is representative of a duty cycle of changed clock 212 and second DC signal 714 is representative of a duty cycle of target clock 710.

Mismatch signal 716 is provided directly to a control input 724 of duty cycle matching circuit 718 (e.g., an output of differential amplifier 706 is directly coupled to an input of duty cycle matching circuit 718, without limitation), and more specifically to a variable delay circuit of duty cycle matching circuit 718, which may be of a waveform shaping circuit of duty cycle matching circuit 718 (respectively not depicted). In this manner, duty cycle matching circuit 718 may generate changed clock 708 at least partially responsive to original clock 722 and the output of differential amplifier 706 (mismatch signal 716).

Figure 8:
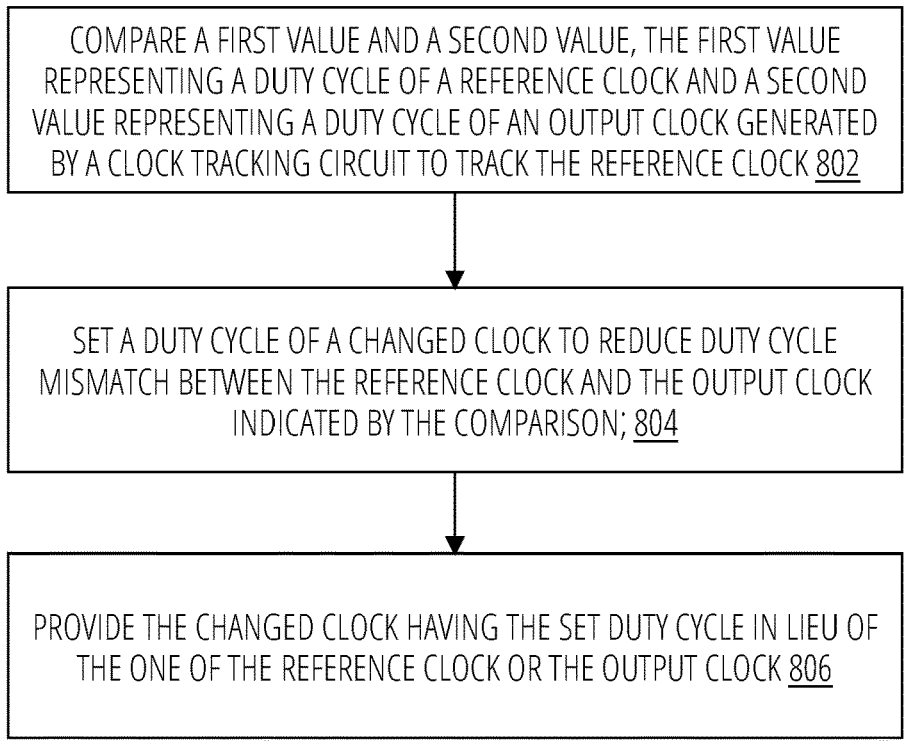
FIG. 8 is a flow diagram depicting a process to change a duty cycle of a clock to match the duty cycle of further clock, in accordance with one or more examples.

FIG. 8 is a flow diagram depicting a process 800 to change a duty cycle of a clock to match the duty cycle of a further clock, in accordance with one or more examples. As a non-limiting example, some or a totality of process 800 may be performed by duty cycle matching circuit 108, apparatus 200 or apparatus 300.

Although FIG. 8 depicts process 800 as a particular sequence of operations, the sequence may be altered without departing from the scope of the present disclosure. In one or more examples, some of the operations depicted may be performed in parallel or in a different sequence that does not materially affect the function of process 800. In one or more examples, different components of an apparatus or system implementing some or a totality of operations of process 800 may perform functions at substantially the same time or in a specific sequence.

At operation 802, process 800 compares (e.g., via a comparison circuit 202, without limitation) a first value and a second value. The first value represents a duty cycle of a reference clock, and the second value represents a duty cycle of an output clock generated by a clock tracking circuit to track the reference clock.

At 804, process 800 sets (e.g., via matching settings 218 provided to duty cycle matching circuit 206 or via an output of comparison circuit 720 provided directly to duty cycle matching circuit 718, without limitation) a duty cycle of a changed clock (e.g., changed clock 212, without limitation) to reduce duty cycle mismatch between the reference clock and the output clock as indicated by the comparison of the first value and the second value. In one or more examples, process 800 may set a duty cycle of the changed clock via a calibration process that includes multiple calibration cycles. Duty cycle mismatch may be incrementally reduced at least partially responsive to respective calibration cycles.

At operation 806, process 800 provides the changed clock (e.g., provides changed clock 212, without limitation) having the set duty cycle in lieu of the one of the reference clock or the output clock (e.g., as a replacement for reference clock 110 or feedback clock 116 as respective inputs of error detector 102, without limitation).

Figure 9:
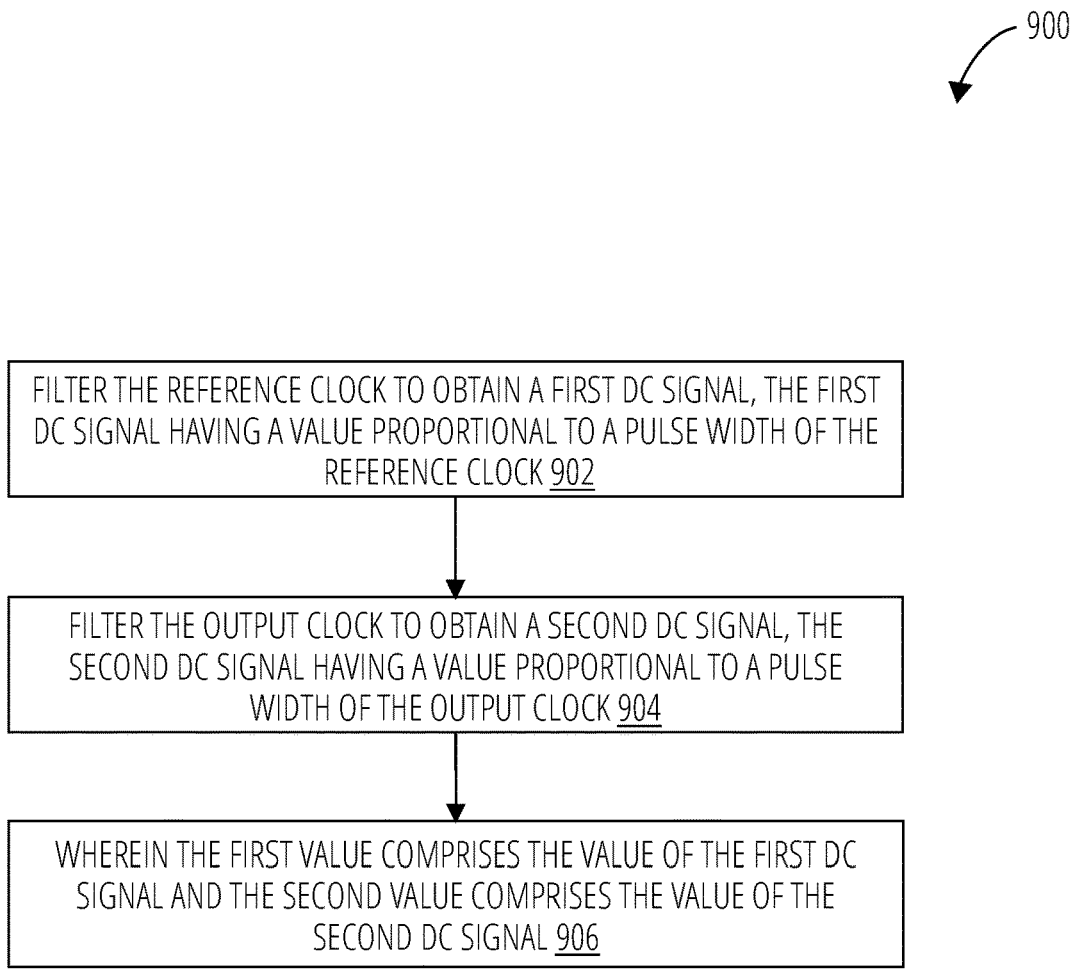
FIG. 9 is a flow diagram depicting a process to indicate which of a first value, representing a duty cycle of a reference clock, or a second value, representing a duty cycle of an output clock (or feedback clock indicating the same), is greater, in accordance with one or more examples.

FIG. 9 is a flow diagram depicting a process 900 to generate values representing respective pulse widths, and thus, respective duty cycles of the reference clock and the output clock generated the clock tracking circuit, in accordance with one or more examples. As a non-limiting example, some or a totality of operations of process 900 may be performed by apparatus 600.

Although FIG. 9 depicts process 900 as a particular sequence of operations, the sequence may be altered without departing from the scope of the present disclosure. In one or more examples, some of the operations depicted may be performed in parallel or in a different sequence that does not materially affect the function of process 900. In one or more examples, different components of an apparatus or system implementing some or a totality of process 900 may perform functions at substantially the same time or in a specific sequence.

At operation 902, process 900 filters (e.g., via first filter 602, without limitation) a reference clock to obtain a first DC signal (e.g., first DC signal 612, without limitation). The first DC signal generated by filtering the reference clock may have a value proportional to a pulse width of the reference clock, and accordingly, a duty cycle of the reference clock in relation to a clock cycle of the reference clock.

At operation 904, process 900 filters (e.g., via second filter 604, without limitation) the output clock to obtain a second DC signal (e.g., second DC signal 614, without limitation). The second DC signal generated by filtering the output clock may have a value proportional to a pulse width of the output clock, and accordingly, a duty cycle of the output clock in relation to a clock cycle of the output clock.

At optional operation 906 of process 900, the first value of operation 902 corresponds to the first DC signal and the second value of operation 902 corresponds to the second DC signal.

Figure 10:
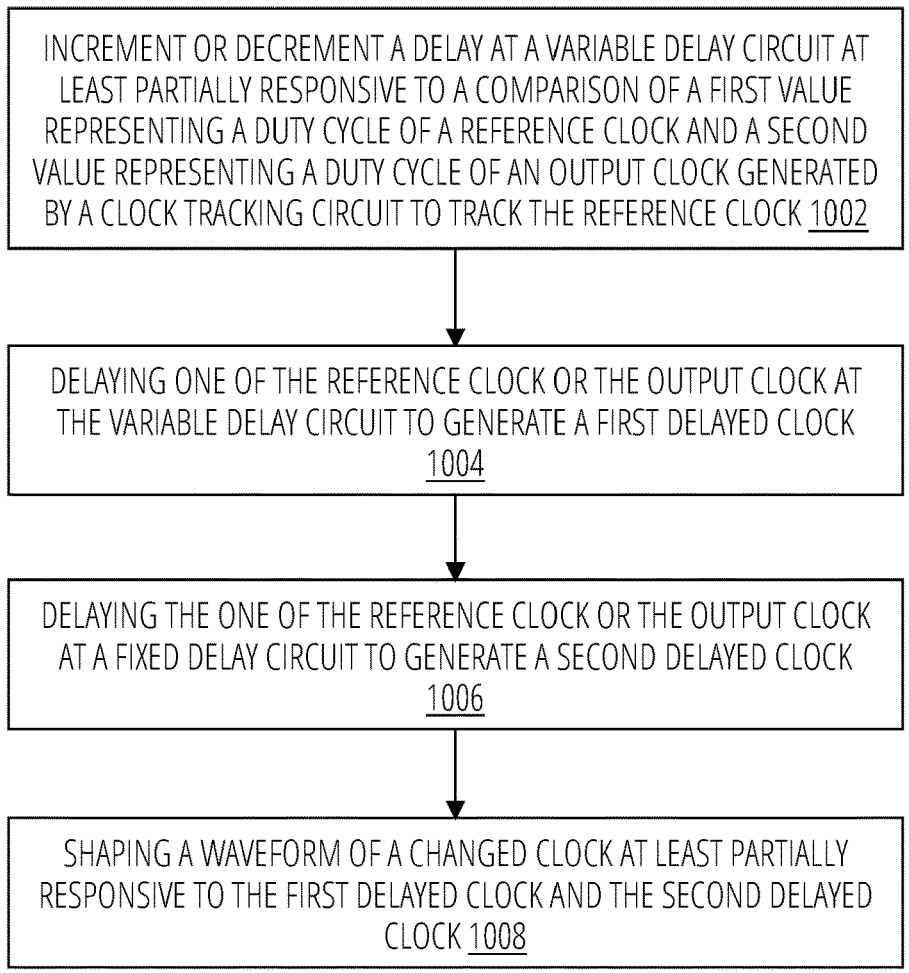
FIG. 10 is a flow diagram depicting a process to set a duty cycle of a changed clock, in accordance with one or more examples.

FIG. 10 is a flow diagram depicting a process 1000 to set a duty cycle of a changed clock, in accordance with one or more examples.

FIG. 10 illustrates an example process to set a duty cycle of a changed clock, in accordance with one or more examples. Although the example routine depicts a particular sequence of operations, the sequence may be altered without departing from the scope of the present disclosure. For example, some of the operations depicted may be performed in parallel or in a different sequence that does not materially affect the function of process 1000. In other examples, different components of an example device or system that implements the routine may perform functions at substantially the same time or in a specific sequence.

At operation 1002, process 1000 increments or decrements (e.g., via delay setting 330 generated by logic circuit 308, without limitation) a delay at a variable delay circuit (e.g., variable delay circuit 302, without limitation) at least partially responsive to a comparison of a first value and a second value. The first value represents a duty cycle of a reference clock and the second value represents a duty cycle of an output clock generated by a clock tracking circuit to track the reference clock. The amount of delay by which the variable delay circuit is incremented or decremented may be a predetermined amount of delay, i.e., a delay step size.

At operation 1004, process 1000 delays one of the reference clock or the output clock at the variable delay circuit to generate a first delayed clock (e.g., first delayed clock 324, without limitation). The delay implemented by the variable delay circuit to delay the reference clock or output clock and generate the first delayed clock 324 has been increased or decreased by the amount of delay by which the variable delay circuit was incremented or decremented in operation 1002.

At operation 1006, process 1000 delays the one of the reference clock or the output clock at a fixed delay circuit (e.g., fixed delay circuit 304, without limitation) to generate a second delayed clock (e.g., second delayed clock 326, without limitation).

At operation 1008, process 1000 shapes a waveform of a changed clock at least partially responsive to the first delayed clock and the second delayed clock. Waveform shaping may be performed at least partially responsive to the comparison of the first value and the second value and a determination of whether to shorten or lengthen a pulse width, and accordingly a duty cycle, of the changed clock.

Figure 11:
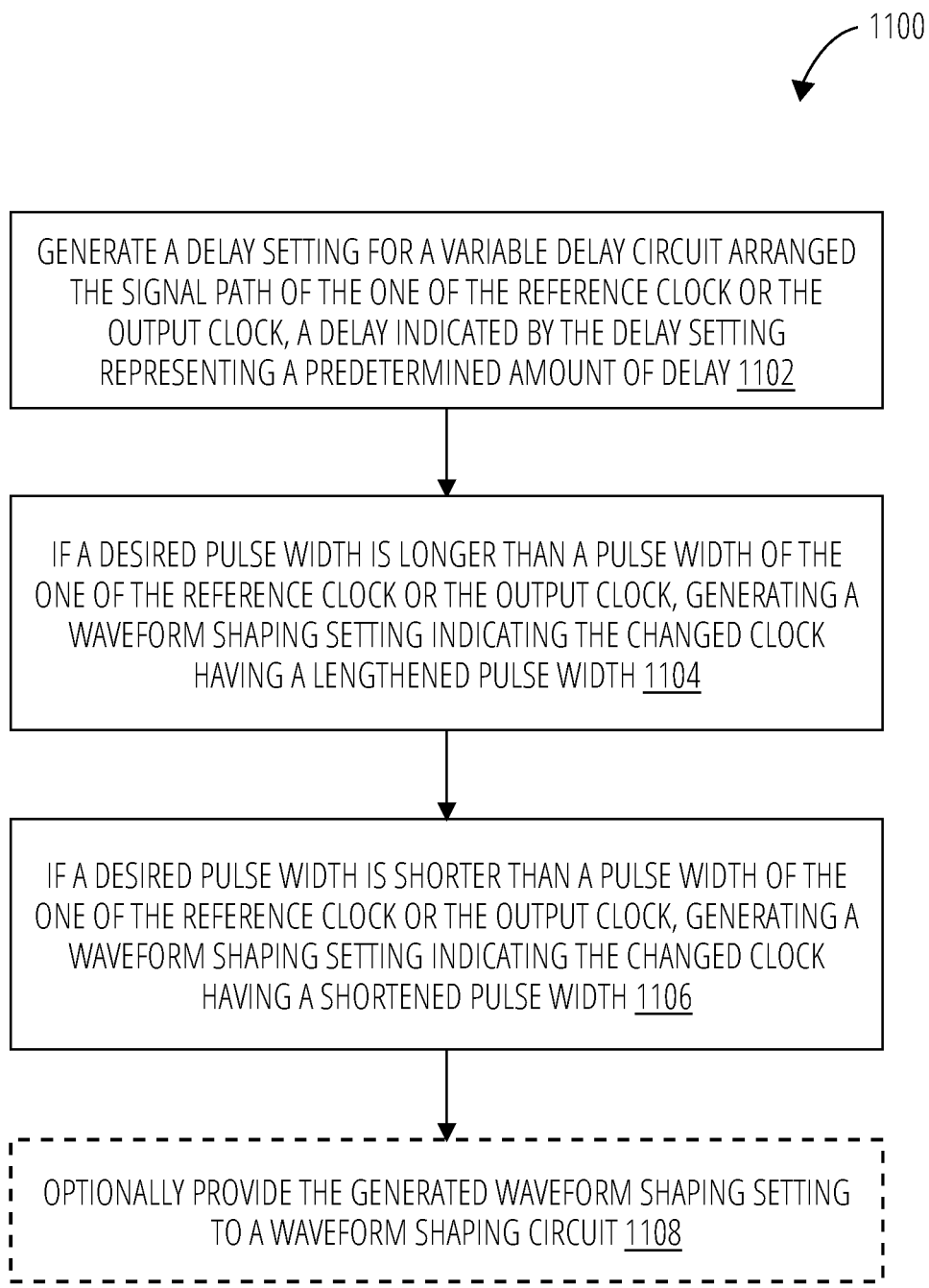
FIG. 11 is a flow diagram depicting a process to generate a changed clock, and more specifically, a clock having a changed duty cycle compared to a duty cycle of an original clock, in accordance with one or more examples.

FIG. 11 is a flow diagram depicting a process 1100 to generate a changed clock, and more specifically, a changed clock having a shaped waveform exhibiting a duty cycle that is different than a duty cycle of an original clock, in accordance with one or more examples. Some or a totality of operations of process 1100 may be performed by logic circuit 208 or logic circuit 308.

Although the example routine depicts a particular sequence of operations, the sequence may be altered without departing from the scope of the present disclosure. For example, some of the operations depicted may be performed in parallel or in a different sequence that does not materially affect the function of process 1000. In other examples, different components of an example device or system that implements the routine may perform functions at substantially the same time or in a specific sequence.

At operation 1102, process 1100 generates a delay setting for a variable delay circuit arranged in a portion of the signal path of one of the reference clock or the output clock. The delay indicated by the delay setting may represent a predetermined amount of delay, i.e., a predetermined multiple of a delay step size.

At operation 1104, if the desired pulse width is longer than the pulse width of the original clock, process 1100 generates a waveform shaping setting indicating the changed clock having a lengthened pulse width.

At operation 1106, if the desired pulse width is shorter than the pulse width of the original clock, process 1100 generates a waveform shaping setting indicating the changed clock having a shortened pulse width.

At optional operation 1108, optionally provide the generated waveform shaping setting (e.g., waveform shaping setting 332, without limitation) to a waveform shaping circuit (e.g., waveform shaping circuit 338, without limitation).

Figure 12:
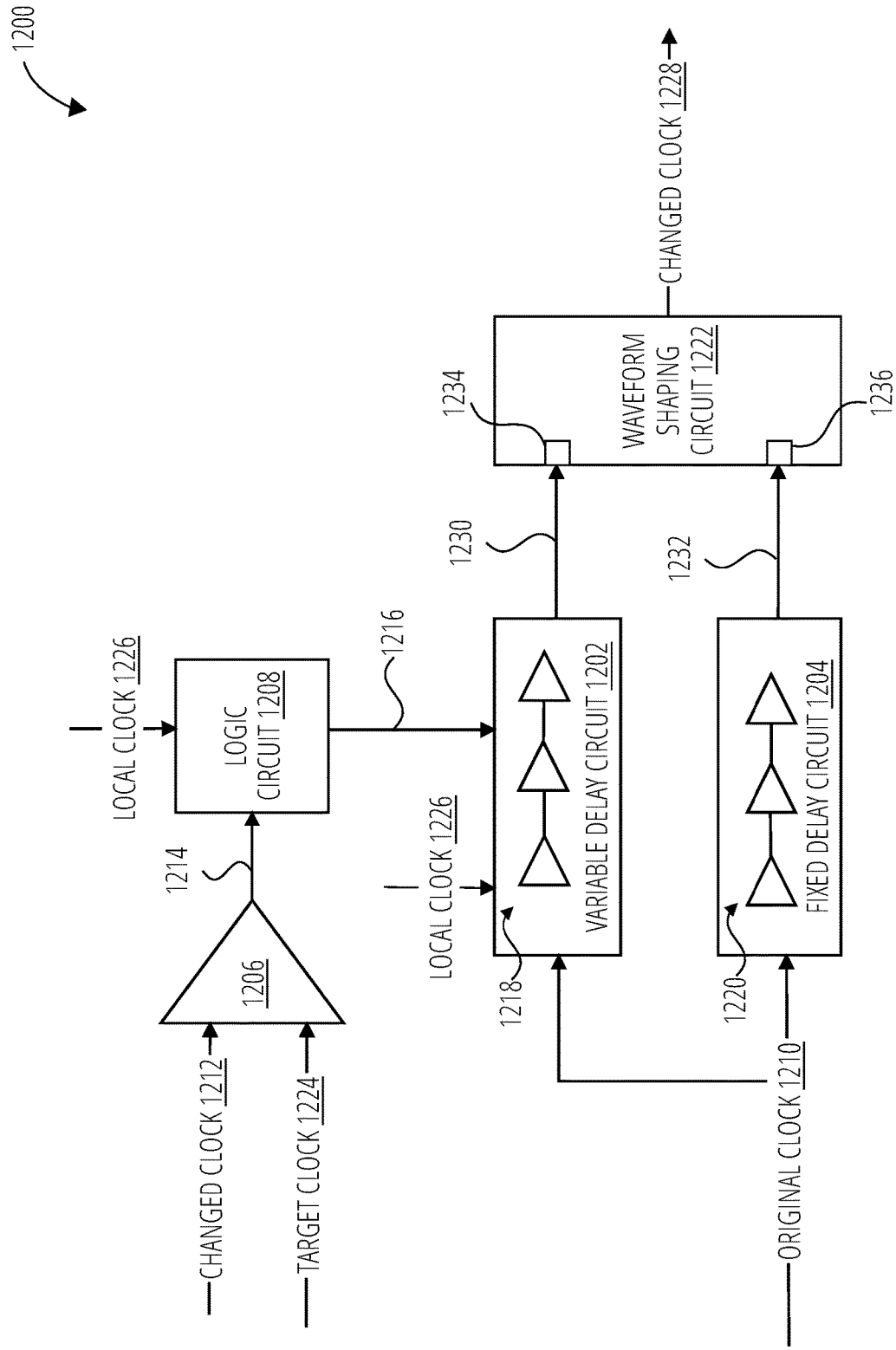
FIG. 12 is a block diagram depicting an apparatus to generate a changed clock, and more specifically, a clock having a changed duty cycle compared to a duty cycle of an original clock, in accordance with one or more examples.

FIG. 12 is a block diagram depicting an apparatus 1200 to generate a changed clock, and more specifically, a clock having a changed duty cycle compared to a duty cycle of an original clock, and more specifically still, a clock having a changed pulse width compared to a pulse width of the original clock, in accordance with one or more examples. Apparatus 300 is a non-limiting example of apparatus 200 or duty cycle matching circuit 108.

Apparatus 1200 includes a variable delay circuit 1202, a fixed delay circuit 1204, a comparison circuit 1206, a logic circuit 1208, and a waveform shaping circuit 1222. Comparison circuit 1206 is similar to comparison circuit 202 of FIG. 2 and is not re-described, here. Further, variable delay circuit 1202, delay cells 1218, fixed delay circuit 1204, and delay cells 1220 are similar to variable delay circuit 302, delay cells 334, fixed delay circuit 304, and delay cells 336 are not re-described here. Further, local clock 1226, changed clock 1212, target clock 1224, and original clock 1210 are similar to local clock 342, changed clock 212, target clock 204 and original clock 214 of FIG. 2, and are not re-described, here.

Initially, respective delays at variable delay circuit 1202 and fixed delay circuit 1204 may be set to ½ the delay range of variable delay circuit 1202. Once set at ½ the delay range, the delay amount at variable delay circuit 1202 may be incremented or decremented by one or more delay amounts by logic circuit 1208 via delay setting 1216.

Waveform shaping circuit 1222 generates changed clock 1228 at least partially responsive to signals received at a first input 1234 and a second input 1236 of waveform shaping circuit 1222. More specifically, waveform shaping circuit 1222 generates changed clock 1228 exhibiting a change from a first state to a second state (a rising edge) at least partially responsive to a signal received at first input 1234, and generates changed clock 1228 exhibiting a change from a second state to a first state (a falling edge) at least partially responsive to a signal received at second input 1236. First input 1234 may be characterized as the "rising edge control input" of waveform shaping circuit 1222 and second input 1236 may be characterized as the "falling edge control input" of waveform shaping circuit 1222.

First input 1234 is coupled to an output of variable delay circuit 1202 and second input 1236 is coupled to an output of fixed delay circuit 1204, accordingly, first input 1234 receives first delayed clock 1230 and second input 1236 receives second delayed clock 1232. Logic of waveform shaping circuit 1222 generates changed clock 1228 exhibiting a rising edge at least partially responsive to first delayed clock 1230 exhibiting a rising edge, and generates changed clock 1228 exhibiting a falling edge at least partially responsive to second delayed clock 1232 exhibiting a falling edge. Waveform shaping circuit 1222 may include, as a non-limiting example, combinational logic circuits to implement generation of changed clock 1228 based on first delayed clock 1230 and second delayed clock 1232 as described herein.

If mismatch signal 1214 indicates a pulse width of changed clock 1212 is too short, logic circuit 1208 may generate delay setting 1216 to decrement a delay amount at variable delay circuit 1202 and thereby increase a pulse width of changed clock 1228. If mismatch signal 1214 indicates a pulse width of changed clock 1212 is too long, logic circuit 1208 may generate delay setting 1216 to increment a delay amount at variable delay circuit 1202 and thereby shorten a pulse width of changed clock 1228.

Figure 13A:
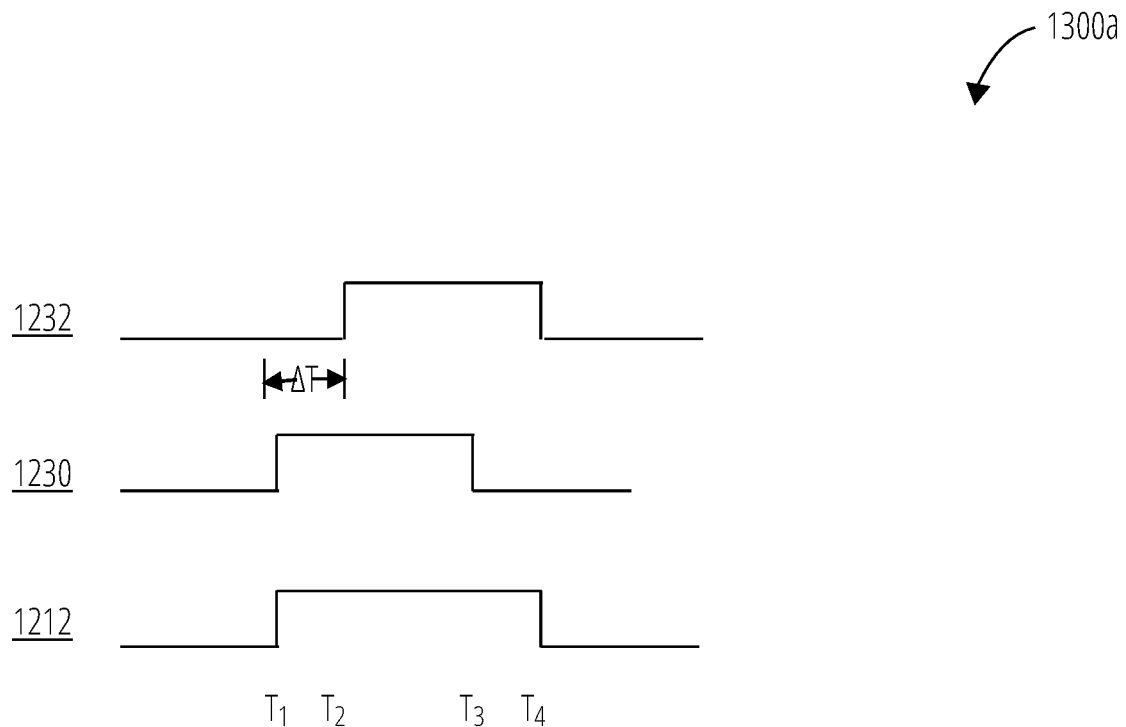
FIG. 13A and FIG. 13B are timing diagrams respectively depicting signals during respective example operations of apparatus FIG. 12, in accordance with one or more examples.
Figure 13B:
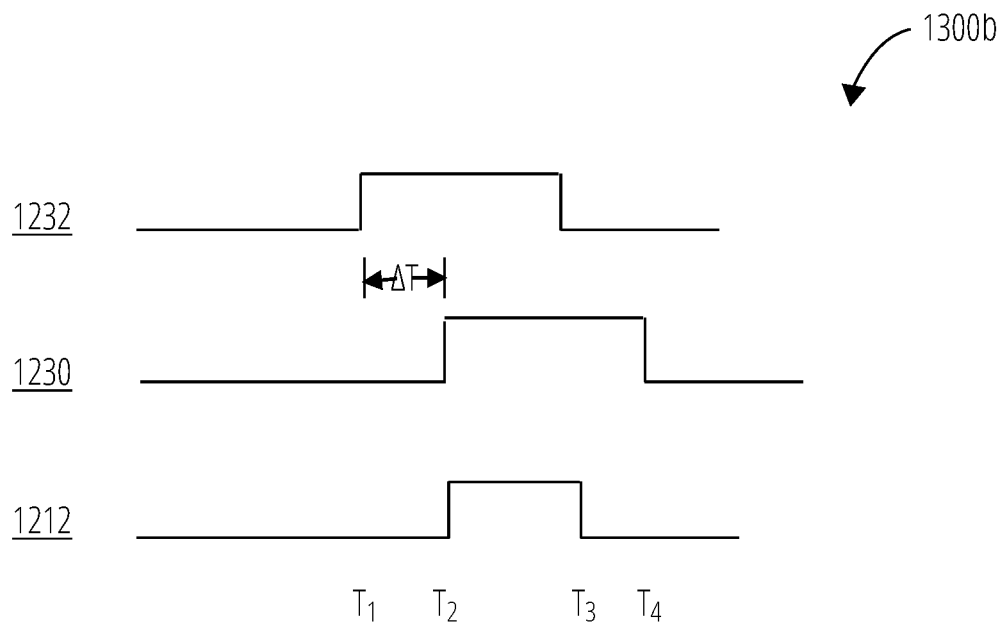

FIG. 13A and FIG. 13B re timing diagrams respectively depicting signals 1300*a* and signals 1300*b* during respective example operations of apparatus 1200.

Specifically, FIG. 13A depicts signals including: second delayed clock 1232, first delayed clock 1230 and changed clock 1212 in an example where a pulse width of original clock 1210 is shorter than a pulse width of target clock 1224. FIG. 13B depicts signals including second delayed clock 1232, first delayed clock 1230 and changed clock 1212 in an example where a pulse width of original clock 1210 is longer than a desired pulse width of target clock 1224.

Turning to an example widening of a short pulse depicted by FIG. 13A:

At time $T_1$, first delayed clock 1230 exhibits a change from a first state to a second, different, state, here, a rising edge. At time $T_1$, waveform shaping circuits 1222 generates changed clock 1212 exhibiting a change from a first state to a second state at least partially responsive to detecting the change from the first state to the second state of first delayed clock 1230.

At time $T_2$, second delayed clock 1232 exhibits a change from the first state to the second state, here, a rising edge, but this change of second delayed clock 1232 does not affect changed clock 1212 generation by waveform shaping circuit 1222.

At time $T_3$, first delayed clock 1230 exhibits a change from the second state to the first state, here, a falling edge, but this change of second delayed clock 1232 does not affect changed clock 1212 generation by waveform shaping circuit 1222.

At time $T_4$, second delayed clock 1232 exhibits a change from the second state to the first state, here, a falling edge. At time $T_2$, waveform shaping circuits 1222 generates changed clock 1212 exhibiting a change from the second state to the first state at least partially responsive to detecting the change from the first state to the second state of first delayed clock 1230. Time duration ΔT in FIG. 13A may substantially equal one or more delay increments implemented by variable delay circuit 1202 discussed above.

Turning to an example shortening of a long pulse depicted by FIG. 13B:

At time $T_1$, first delayed clock 1230 exhibits a change from a first state to a second, different, state, here, a rising edge, but this change of second delayed clock 1232 does not affect changed clock 1212 generation by waveform shaping circuit 1222.

At time $T_2$, first delayed clock 1230 exhibits a change from a first state to a second, different, state, here, a rising edge. At time $T_2$, waveform shaping circuits 1222 generates changed clock 1212 exhibiting a change from a first state to a second state at least partially responsive to detecting the change from the first state to the second state of first delayed clock 1230.

At time $T_3$, second delayed clock 1232 exhibits a change from the second state to the first state, here, a falling edge. At time $T_3$, waveform shaping circuits 1222 generates changed clock 1212 exhibiting a change from the second state to the first state at least partially responsive to detecting the change from the first state to the second state of first delayed clock 1230. Time duration ΔT in FIG. 13A may substantially equal one or more delay increments implemented by variable delay circuit 1202, discussed above.

At time $T_4$, first delayed clock 1230 exhibits a change from the second state to the first state, here, a falling edge, but this change of first delayed clock 1230 does not affect changed clock 1212 generation by waveform shaping circuit 1222.

Figure 14:
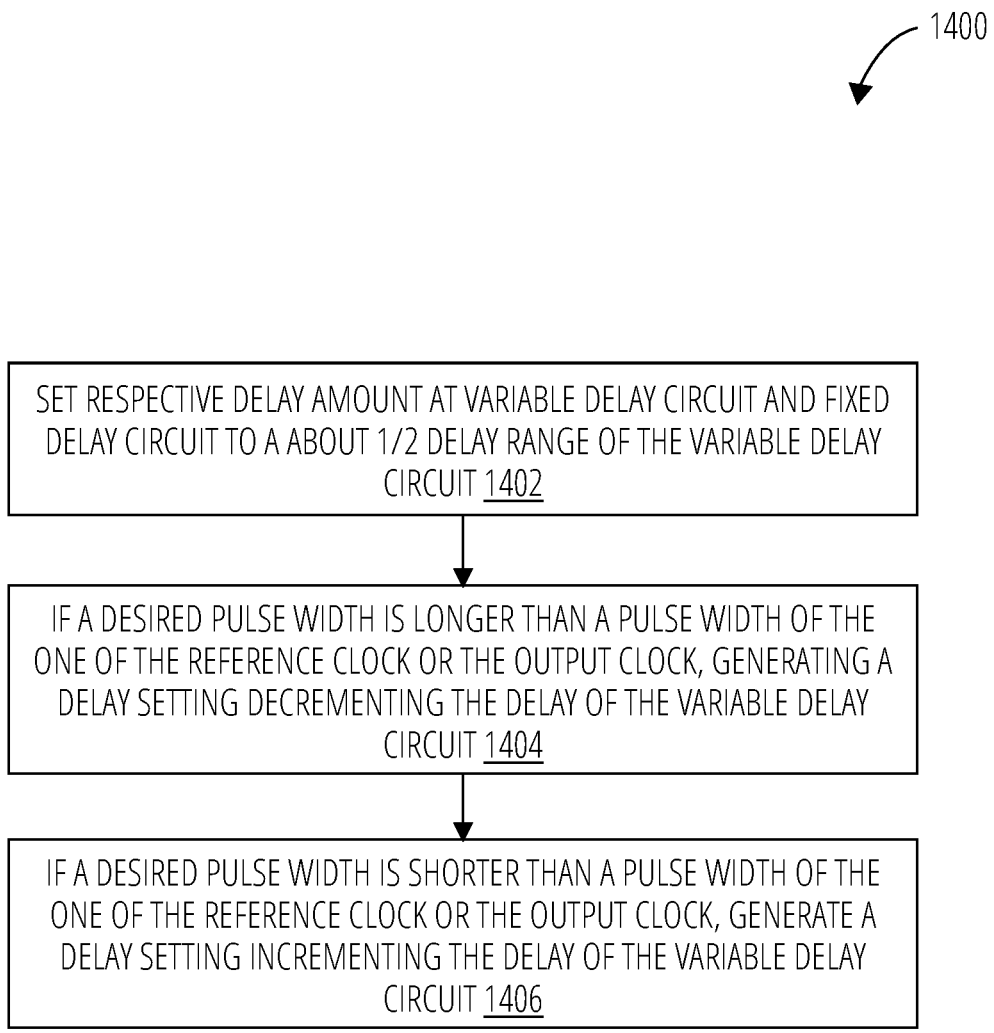
FIG. 14 is a flow diagram depicting a process to generate delay settings to set the amount of delay of a variable delay circuit or fixed delay circuits of FIG. 12, in accordance with one or more examples.

FIG. 14 is a flow diagram depicting a process 1400 to generate delay settings 1216 to set the amount of delay variable delay circuit 1202 or fixed delay circuit 1204 of FIG. 12, in accordance with one or more examples.

Although the example process 1400 depicts a particular sequence of operations, the sequence may be altered without departing from the scope of the present disclosure. For example, some of the operations depicted may be performed in parallel or in a different sequence that does not materially affect the function of the process 1400. In other examples, different components of an example device or system that implements the process 1400 may perform functions at substantially the same time or in a specific sequence.

At operation 1402, process 1400 sets respective delay amount at variable delay circuit and fixed delay circuit to a about ½ delay range of the variable delay circuit.

At operation 1404, process 1400, if a desired pulse width is longer than a pulse width of the one of the reference clock or the output clock, generates a delay setting decrementing the delay of the variable delay circuit.

At operation 1406, process 1400, if a desired pulse width is shorter than a pulse width of the one of the reference clock or the output clock, generates a delay setting incrementing the delay of the variable delay circuit.

Figure 15:
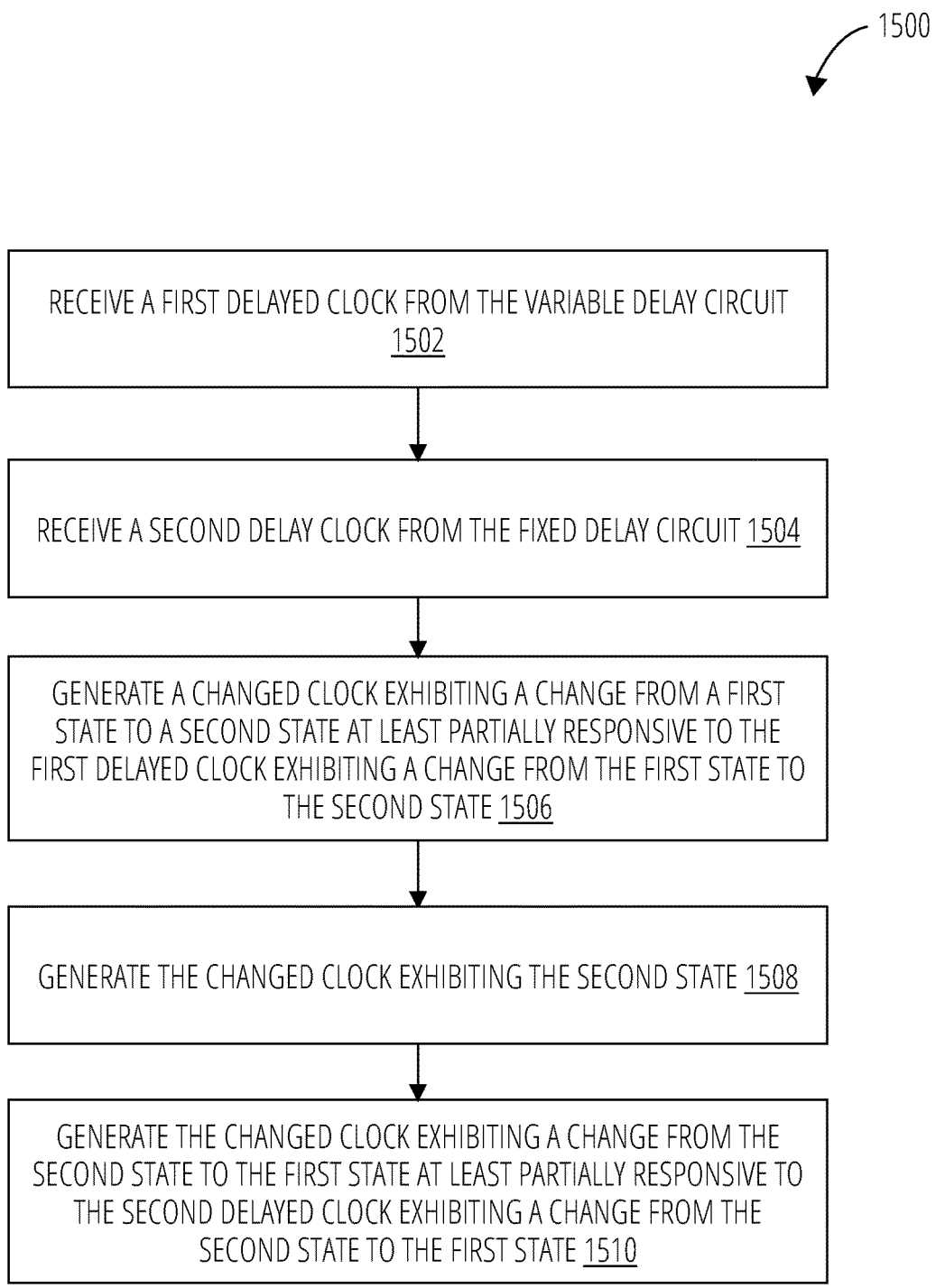
FIG. 15 is a flow diagram depicting a process to generate a change clock via waveform shaping circuit of FIG. 12, in accordance with one or more examples.

FIG. 15 is a flow diagram depicting a process 1500 to generate a change clock via waveform shaping circuit 1222 of FIG. 12, in accordance with one or more examples.

Although the example process 1500 depicts a particular sequence of operations, the sequence may be altered without departing from the scope of the present disclosure. For example, some of the operations depicted may be performed in parallel or in a different sequence that does not materially affect the function of the process 1500. In other examples, different components of an example device or system that implements the process 1500 may perform functions at substantially the same time or in a specific sequence.

At operation 1502, process 1500 receives a first delayed clock (e.g., first delayed clock 1230, without limitation) from the variable delay circuit (e.g., variable delay circuit 1202, without limitation).

At operation 1504, process 1500 receives a second delay clock (e.g., second delayed clock 1232, without limitation) via the fixed delay circuit (e.g., fixed delay circuit 1204, without limitation).

At operation 1506, process 1500 generates a changed clock (e.g., changed clock 1228, without limitation) exhibiting a change from a first state to a second state (a rising edge) at least partially responsive to the first delayed clock (e.g., first delayed clock 1230, without limitation) exhibiting a change from the first state to the second state (a rising edge).

At operation 1508, process 1500 generates the changed clock (e.g., changed clock 1228, without limitation) exhibiting the second state.

At operation 1510, process 1500 generates the changed clock (e.g., changed clock 1228, without limitation) exhibiting a change from the second state to the first state (a falling edge) at least partially responsive to the second delayed clock (e.g., second delayed clocks 1232, without limitation) exhibiting a change from the second state to the first state (a falling edge).

Figure 16:
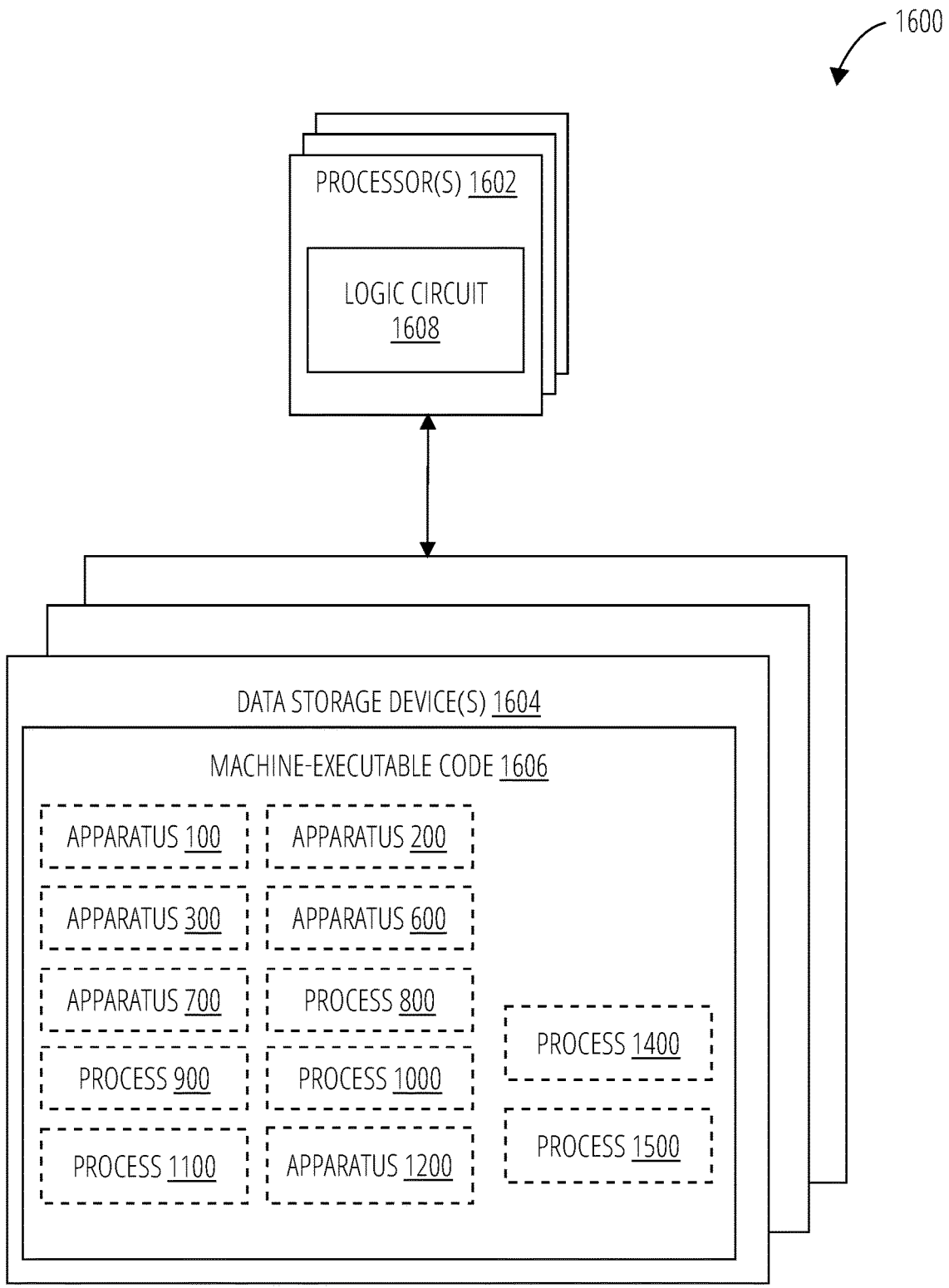
FIG. 16 is a block diagram of circuitry that, in some examples, may be used to implement various functions, operations, acts, processes, or methods disclosed herein.

It will be appreciated by those of ordinary skill in the art that functional elements of examples disclosed herein (e.g., functions, operations, acts, processes, or methods) may be implemented in any suitable hardware, software, firmware, or combinations thereof. FIG. 16 illustrates non-limiting examples of implementations of functional elements disclosed herein. In some examples, some or all portions of the functional elements disclosed herein may be performed by hardware specially configured for carrying out the functional elements.

FIG. 16 is a block diagram of a circuit 1600 that, in some examples, may be used to implement various functions, operations, acts, processes, or methods disclosed herein. The circuit 1600 includes one or more processors 1602 (sometimes referred to herein as "processors 1602") operably coupled to one or more data storage devices 1604 (sometimes referred to herein as "storage 1604"). The storage 1604 includes machine-executable code 1606 stored thereon and the processors 1602 include logic circuit 1608. The machine-executable code 1606 information describing functional elements that may be implemented by (e.g., performed by) the logic circuit 1608. The logic circuit 1608 is adapted to implement (e.g., perform) the functional elements described by the machine-executable code 1606. The circuit 1600, when executing the functional elements described by the machine-executable code 1606, should be considered as special purpose hardware configured for carrying out functional elements disclosed herein. In some examples the processors 1602 may be configured to perform the functional elements described by the machine-executable code 1606 sequentially, concurrently (e.g., on one or more different hardware platforms), or in one or more parallel process streams.

When implemented by logic circuit 1608 of the processors 1602, the machine-executable code 1606 adapts the processors 1602 to perform operations of examples disclosed herein. By way of non-limiting example, the machine-executable code 1606 may adapt the processors 1602 to perform some or a totality of operations of one or more of: process 800, process 900, process 1000, process 1100, process 1400, or process 1500.

Also by way of non-limiting example, the machine-executable code 1606 may adapt the processors 1602 to perform some or a totality of features, functions, or operations disclosed herein for one or more of: apparatus 100, including error detector 102, controller 104, controlled-oscillator 106, or duty cycle matching circuit 108; apparatus 200, including, comparison circuit 202, logic circuit 208, signal path 210, or duty cycle matching circuit 206; apparatus 300, including, variable delay circuit 302, fixed delay circuit 304, comparison circuit 306, logic circuit 308, waveform shaping circuit 338, wide logic circuit 320, skinny logic circuit 322, or multiplexer 310. apparatus 600, including, first filter 602, second filter 604, or comparator circuit 606; apparatus 700, including first filter 702, second filter 704, differential amplifier 706, duty cycle matching circuit 718; or apparatus 1200, including comparison circuit 1206, logic circuit 1208, variable delay circuit 1202, fixed delay circuit 1204, or waveform shaping circuit 1222.

The processors 1602 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is configured to execute functional elements corresponding to the machine-executable code 1606 (e.g., software code, firmware code, hardware descriptions) related to examples of the present disclosure. It is noted that a general-purpose processor (may also be referred to herein as a host processor or simply a host) may be a microprocessor, but in the alternative, the processors 1602 may include any conventional processor, controller, microcontroller, or state machine. The processors 1602 may also be implemented as a combination of computing devices, such as a combination of a DSP and a microprocessor, a plurality of microprocessors, one or more microprocessors in conjunction with a DSP core, or any other such configuration.

In some examples the storage 1604 includes volatile data storage (e.g., random-access memory (RAM)), non-volatile data storage (e.g., Flash memory, a hard disc drive, a solid state drive, erasable programmable read-only memory (EPROM), without limitation). In some examples the processors 1602 and the storage 1604 may be implemented into a single device (e.g., a semiconductor device product, a system on chip (SOC), without limitation). In some examples the processors 1602 and the storage 1604 may be implemented into separate devices.

In some examples the machine-executable code 1606 may include computer-readable instructions (e.g., software code, firmware code). By way of non-limiting example, the computer-readable instructions may be stored by the storage 1604, accessed directly by the processors 1602, and executed by the processors 1602 using at least the logic circuit 1608. Also by way of non-limiting example, the computer-readable instructions may be stored on the storage 1604, transferred to a memory device (not shown) for execution, and executed by the processors 1602 using at least the logic circuit 1608. Accordingly, in some examples the logic circuit 1608 includes electrically configurable logic circuit 1608.

In some examples the machine-executable code 1606 may describe hardware (e.g., circuitry) to be implemented in the logic circuit 1608 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, Verilog, System-Verilog or very large scale integration (VLSI) hardware description language (VHDL) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuit 1608 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some examples the machine-executable code 1606 may include an HDL, an RTL, a GL description, a mask level description, other hardware description, or any combination thereof.

In examples where the machine-executable code 1606 includes a hardware description (at any level of abstraction), a system (not shown, but including the storage 1604) may be configured to implement the hardware description described by the machine-executable code 1606. By way of non-limiting example, the processors 1602 may include a programmable logic device (e.g., an FPGA or a PLC) and the logic circuit 1608 may be electrically controlled to implement circuitry corresponding to the hardware description into the logic circuit 1608. Also by way of non-limiting example, the logic circuit 1608 may include hard-wired logic manufactured by a manufacturing system (not shown, but including the storage 1604) according to the hardware description of the machine-executable code 1606.

Regardless of whether the machine-executable code 1606 includes computer-readable instructions or a hardware description, the logic circuit 1608 is adapted to perform the functional elements described by the machine-executable code 1606 when implementing the functional elements of the machine-executable code 1606. It is noted that although a hardware description may not directly describe functional elements, a hardware description indirectly describes functional elements that the hardware elements described by the hardware description are capable of performing.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, without limitation) of the computing system. In some examples, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims, without limitation) are generally intended as "open" terms (e.g., the term "including" should be interpreted as "including, but not limited to," the term "having" should be interpreted as "having at least," the term "includes" should be interpreted as "includes, but is not limited to," without limitation). As used herein, the term "each" means "some or a totality." As used herein, the term "each and every" means a "totality."

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more," without limitation); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations, without limitation). Furthermore, in those instances where a convention analogous to "at least one of A, B, and C, without limitation" or "one or more of A, B, and C, without limitation" is used, in general such a construction is intended to include A alone, B alone, C alone, A and B together, A and C together, B and C together, or A, B, and C together, without limitation.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Example 1: A method, comprising: comparing a first value and a second value, the first value representing a duty cycle of a reference clock and the second value representing a duty cycle of an output clock generated by a clock tracking circuit to track the reference clock; setting a duty cycle of a changed clock to reduce duty cycle mismatch between the reference clock and the output clock indicated by the comparing; and providing the changed clock having set duty cycle in lieu of the one of the reference clock or the output clock.

Example 2: The method according to Example 1, wherein the setting the duty cycle of the changed clock at least partially responsive to the comparing comprises: incrementing or decrementing a delay at a variable delay circuit at least partially responsive to the comparing; delaying one of the reference clock or the output clock at the variable delay circuit to generate a first delayed clock; delaying one of the reference clock or the output clock at a fixed delay circuit to generate a second delayed clock; and shaping a waveform of the changed clock at least partially responsive to the first delayed clock and the second delayed clock.

Example 3: The method according to any of Examples 1 and 2, comprising: generating a delay setting for the variable delay circuit, the delay setting indicating an increment or a decrement.

Example 4: The method according to any of Examples 1 through 3, wherein an amount of delay by which the delay at the variable delay circuit is incremented or decremented is a predetermined amount of delay.

Example 5: The method according to any of Examples 1 through 4, wherein shaping the waveform of the changed clock at least partially responsive to the first delayed clock and the second delayed clock comprises: if a desired pulse width is longer than a pulse width of the one of the reference clock or the output clock, generating a waveform shaping setting indicating the changed clock having a lengthened pulse width.

Example 6: The method according to any of Examples 1 through 5, wherein shaping the waveform of the changed clock at least partially responsive to the first delayed clock and the second delayed clock comprises: if a desired pulse width is shorter than a pulse width of the one of the reference clock or the output clock, generating a waveform shaping setting indicating the changed clock having a shortened pulse width.

Example 7: The method according to any of Examples 1 through 6, comprising: filtering the reference clock to obtain a first direct current (DC) signal, the first DC signal having a value proportional to a pulse width of the reference clock; and filtering the output clock to obtain a second DC signal, the second DC signal proportional to a pulse width of the output clock, wherein the first value comprising the value of the first DC signal and the second value comprising the value of the second DC signal.

Example 8: An apparatus, comprising: a comparison circuit to receive a reference clock and an output clock generated by a clock tracking circuit to track the reference clock; a duty cycle matching circuit arranged in a signal path of one of the reference clock or the output clock, the matching circuit to set a duty cycle of a changed clock and provide the changed clock in lieu of the one of the reference clock or the output clock; and a logic circuit to set the matching circuit to reduce duty cycle mismatch between the reference clock and the output clock indicated by an output of the comparison circuit.

Example 9: The apparatus according to Example 8, wherein the matching circuit comprises: a variable delay circuit to generate a first delayed clock at least partially responsive to the one of the reference clock or the output clock; a fixed delay circuit to generate a second delayed clock at least partially responsive to the one of the reference clock or the output clock; and a waveform shaping circuit to shape a waveform of the changed clock at least partially responsive to the first delayed clock and the second delayed clock.

Example 10: The apparatus according to any of Examples 8 and 9, wherein the logic circuit to set the matching circuit by: generating a delay setting to set a delay of the variable delay circuit; and generating a waveform shaping setting to set a waveform shaping function of the waveform shaping circuit.

Example 11: The apparatus according to any of Examples 8 through 10, wherein the delay setting indicates an increment or a decrement.

Example 12: The apparatus according to any of Examples 8 through 11, wherein the waveform shaping circuit comprises: a wide logic circuit to generate a first changed clock having a pulse width shorter than the pulse width of the one of the reference clock or the output clock; a skinny logic circuit to generate a second changed clock having a pulse width longer than the pulse width of the one of the reference clock or the output clock; and a multiplexer to provide one of the first changed clock or the second changed clock, wherein the changed clock comprises the provided one of the first changed clock or the second changed clock.

Example 13: The apparatus according to any of Examples 8 through 12, wherein the logic circuit to set the matching circuit by: if a desired pulse width is longer than a pulse width of the one of the reference clock or the output clock, generating a delay setting decrementing the delay of the variable delay circuit; and if a desired pulse width is shorter than a pulse width of the one of the reference clock or the output clock, generate a delay setting incrementing the delay of the variable delay circuit.

Example 14: The apparatus according to any of Examples 8 through 13, wherein the waveform shaping circuit to: generate the changed clock exhibiting a change from a first state to a second state at least partially responsive to the first delayed clock exhibiting a change from the first state to the second state; and generate the changed clock exhibiting a change from the second state to the first state at least partially responsive to the second delayed clock exhibiting a change from the second state to the first state.

Example 15: The apparatus according to any of Examples 8 through 14, comprising: a comparison circuit to receive a reference clock and an output clock generated by a clock tracking circuit to track the reference clock; a duty cycle matching circuit arranged in a signal path of one of the reference clock or the output clock, the matching circuit to set a duty cycle of a changed clock and provide the changed clock in lieu of the one of the reference clock or the output clock; and a logic circuit to set the matching circuit to reduce duty cycle mismatch between the reference clock and the output clock indicated by an output of the comparison circuit.

Example 16: The apparatus according to any of Examples 8 through 15, wherein the comparison circuit comprises: a first filter to filter the reference clock to obtain a first direct current (DC) signal, the first DC signal proportional to a pulse width of the reference clock; a second filter to filter the output clock to obtain a second DC signal, the second DC signal proportional to a pulse width of the output clock; and a comparator to compare the first DC signal and the second DC signal and generate an indication of mismatch between the first DC signal and the DC signal.

Example 17: The apparatus according to any of Examples 8 through 16, wherein the clock tracking circuit is chosen from a group, the group including: a hybrid phase locked loop (PLL), an analog PLL, a digital PLL, a delay locked loop, an injection locked loop, or a frequency synthesizer.

Example 18: An apparatus, comprising: a differential amplifier coupled to receive a reference clock and an output clock generated by a clock tracking circuit to track the reference clock; and a duty cycle matching circuit arranged in a signal path of one of the reference clock or the output clock, the matching circuit to: set a duty cycle of a changed clock at least partially responsive to duty cycle mismatch indicated by an output of the differential amplifier; and provide the changed clock in lieu of the one of the reference clock or the output clock.

Example 19: The apparatus according to Example 18, wherein the matching circuit comprises: a variable delay circuit having a control input directly coupled to an output of the differential amplifier; a fixed delay circuit; and a waveform shaping circuit having an input directly coupled to an output of the differential amplifier.

While the present disclosure has been described herein with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

What is claimed is:

1. A method, comprising:
comparing a first value and a second value, the first value representing a duty cycle of a reference clock and the second value representing a duty cycle of an output clock generated by a clock tracking circuit to track the reference clock;
setting a duty cycle of a changed clock to reduce duty cycle mismatch between the reference clock and the output clock indicated by the comparing; and
providing the changed clock having set duty cycle in lieu of the one of the reference clock or the output clock.

2. The method of claim 1, wherein the setting the duty cycle of the changed clock at least partially responsive to the comparing comprises:
incrementing or decrementing a delay at a variable delay circuit at least partially responsive to the comparing;
delaying one of the reference clock or the output clock at the variable delay circuit to generate a first delayed clock;
delaying one of the reference clock or the output clock at a fixed delay circuit to generate a second delayed clock; and
shaping a waveform of the changed clock at least partially responsive to the first delayed clock and the second delayed clock.

3. The method of claim 2, comprising:
generating a delay setting for the variable delay circuit, the delay setting indicating an increment or a decrement.

4. The method of claim 3, wherein an amount of delay by which the delay at the variable delay circuit is incremented or decremented is a predetermined amount of delay.

5. The method of claim 2, wherein shaping the waveform of the changed clock at least partially responsive to the first delayed clock and the second delayed clock comprises:
if a desired pulse width is longer than a pulse width of the one of the reference clock or the output clock, generating a waveform shaping setting indicating the changed clock having a lengthened pulse width.

6. The method of claim 2, wherein shaping the waveform of the changed clock at least partially responsive to the first delayed clock and the second delayed clock comprises:
if a desired pulse width is shorter than a pulse width of the one of the reference clock or the output clock, generating a waveform shaping setting indicating the changed clock having a shortened pulse width.

7. The method of claim 1, comprising:
filtering the reference clock to obtain a first direct current (DC) signal, the first DC signal having a value proportional to a pulse width of the reference clock; and
filtering the output clock to obtain a second DC signal, the second DC signal proportional to a pulse width of the output clock,
wherein the first value comprising the value of the first DC signal and the second value comprising the value of the second DC signal.

8. An apparatus, comprising:
a comparison circuit to receive a reference clock and an output clock generated by a clock tracking circuit to track the reference clock;
a duty cycle matching circuit arranged in a signal path of one of the reference clock or the output clock, the matching circuit to set a duty cycle of a changed clock and provide the changed clock in lieu of the one of the reference clock or the output clock; and a logic circuit to set the matching circuit to reduce duty cycle mismatch between the reference clock and the output clock indicated by an output of the comparison circuit.

9. The apparatus of claim 8, wherein the matching circuit comprises:
a variable delay circuit to generate a first delayed clock at least partially responsive to the one of the reference clock or the output clock;
a fixed delay circuit to generate a second delayed clock at least partially responsive to the one of the reference clock or the output clock; and
a waveform shaping circuit to shape a waveform of the changed clock at least partially responsive to the first delayed clock and the second delayed clock.

10. The apparatus of claim 9, wherein the logic circuit to set the matching circuit by:
generating a delay setting to set a delay of the variable delay circuit; and
generating a waveform shaping setting to set a waveform shaping function of the waveform shaping circuit.

11. The apparatus of claim 10, wherein the delay setting indicates an increment or a decrement.

12. The apparatus of claim 9, wherein the waveform shaping circuit comprises:
a wide logic circuit to generate a first changed clock having a pulse width shorter than the pulse width of the one of the reference clock or the output clock;
a skinny logic circuit to generate a second changed clock having a pulse width longer than the pulse width of the one of the reference clock or the output clock; and
a multiplexer to provide one of the first changed clock or the second changed clock,
wherein the changed clock comprises the provided one of the first changed clock or the second changed clock.

13. The apparatus of claim 9, wherein the logic circuit to set the matching circuit by:
if a desired pulse width is longer than a pulse width of the one of the reference clock or the output clock, generating a delay setting decrementing the delay of the variable delay circuit; and
if a desired pulse width is shorter than a pulse width of the one of the reference clock or the output clock, generate a delay setting incrementing the delay of the variable delay circuit.

14. The apparatus of claim 13, wherein the waveform shaping circuit to:
generate the changed clock exhibiting a change from a first state to a second state at least partially responsive to the first delayed clock exhibiting a change from the first state to the second state; and
generate the changed clock exhibiting a change from the second state to the first state at least partially responsive to the second delayed clock exhibiting a change from the second state to the first state.

15. The apparatus of claim 9, comprising:
a comparison circuit to receive a reference clock and an output clock generated by a clock tracking circuit to track the reference clock;
a duty cycle matching circuit arranged in a signal path of one of the reference clock or the output clock, the matching circuit to set a duty cycle of a changed clock and provide the changed clock in lieu of the one of the reference clock or the output clock; and
a logic circuit to set the matching circuit to reduce duty cycle mismatch between the reference clock and the output clock indicated by an output of the comparison circuit.

16. The apparatus of claim 8, wherein the comparison circuit comprises:
a first filter to filter the reference clock to obtain a first direct current (DC) signal, the first DC signal proportional to a pulse width of the reference clock;
a second filter to filter the output clock to obtain a second DC signal, the second DC signal proportional to a pulse width of the output clock; and
a comparator to compare the first DC signal and the second DC signal and generate an indication of mismatch between the first DC signal and the DC signal.

17. The apparatus of claim 8, wherein the clock tracking circuit is chosen from a group, the group including: a hybrid phase locked loop (PLL), an analog PLL, a digital PLL, a delay locked loop, an injection locked loop, or a frequency synthesizer.

18. An apparatus, comprising:
a differential amplifier coupled to receive a reference clock and an output clock generated by a clock tracking circuit to track the reference clock; and
a duty cycle matching circuit arranged in a signal path of one of the reference clock or the output clock, the matching circuit to:
set a duty cycle of a changed clock at least partially responsive to duty cycle mismatch indicated by an output of the differential amplifier; and
provide the changed clock in lieu of the one of the reference clock or the output clock.

19. The apparatus of claim 18, wherein the matching circuit comprises:
a variable delay circuit having a control input directly coupled to an output of the differential amplifier;
a fixed delay circuit; and
a waveform shaping circuit having an input directly coupled to an output of the differential amplifier.

* * * * *